(12) United States Patent
Yang et al.

(10) Patent No.: US 11,475,972 B2
(45) Date of Patent: Oct. 18, 2022

(54) NON-VOLATILE MEMORY DEVICE, CONTROLLER FOR CONTROLLING THE SAME, STORAGE DEVICE HAVING THE SAME, AND READING METHOD THEREOF

(71) Applicant: Samsung Electronics Co., Ltd., Suwon-si (KR)

(72) Inventors: Younghwi Yang, Suwon-si (KR); Ilhan Park, Suwon-si (KR); Jinyoung Kim, Seoul (KR); Sehwan Park, Yongin-si (KR); Dongmin Shin, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/368,460

(22) Filed: Jul. 6, 2021

(65) Prior Publication Data

US 2022/0180957 A1 Jun. 9, 2022

(30) Foreign Application Priority Data

Dec. 7, 2020 (KR) .................. 10-2020-0169715

(51) Int. Cl.
*G11C 29/42* (2006.01)
*G11C 29/44* (2006.01)
*G11C 29/12* (2006.01)
*G11C 7/10* (2006.01)
*H03K 19/21* (2006.01)

(52) U.S. Cl.
CPC .............. *G11C 29/42* (2013.01); *G11C 7/106* (2013.01); *G11C 7/1039* (2013.01); *G11C 7/1087* (2013.01); *G11C 29/12005* (2013.01); *G11C 29/4401* (2013.01); *H03K 19/21* (2013.01); *G11C 2029/1202* (2013.01); *G11C 2029/1204* (2013.01)

(58) Field of Classification Search
CPC ....... G11C 29/42; G11C 7/1039; G11C 7/106; G11C 7/1087
See application file for complete search history.

(56) References Cited

U.S. PATENT DOCUMENTS

| | | | |
|---|---|---|---|
| 8,125,827 B2 | 2/2012 | Park | |
| 8,139,412 B2 | 3/2012 | Kohler et al. | |
| 9,009,390 B2 | 4/2015 | Choi et al. | |
| 10,529,432 B2 | 1/2020 | Park | |
| 2012/0155186 A1* | 6/2012 | Chokan | G11C 16/3459 365/185.22 |
| 2014/0063944 A1* | 3/2014 | Lee | G11C 29/42 365/185.09 |
| 2019/0206497 A1* | 7/2019 | Lim | H01L 27/11582 |
| 2020/0090763 A1 | 3/2020 | Tokutomi et al. | |
| 2020/0211654 A1 | 7/2020 | Asami et al. | |

FOREIGN PATENT DOCUMENTS

KR 10-1005133 B1 1/2011

\* cited by examiner

*Primary Examiner* — Han Yang
(74) *Attorney, Agent, or Firm* — Muir Patent Law, PLLC

(57) ABSTRACT

A controller includes control pins, a buffer memory, an error correction circuit, and a processor driving a read level search unit for a read operation of at least one non-volatile memory device, in which the read level search unit receives fail bit information of a sector error-corrected in the first page from the at least one non-volatile memory device when the error correction of the first read data is not possible, and searches for an optimal read level or set a soft decision offset using the fail bit information.

20 Claims, 24 Drawing Sheets

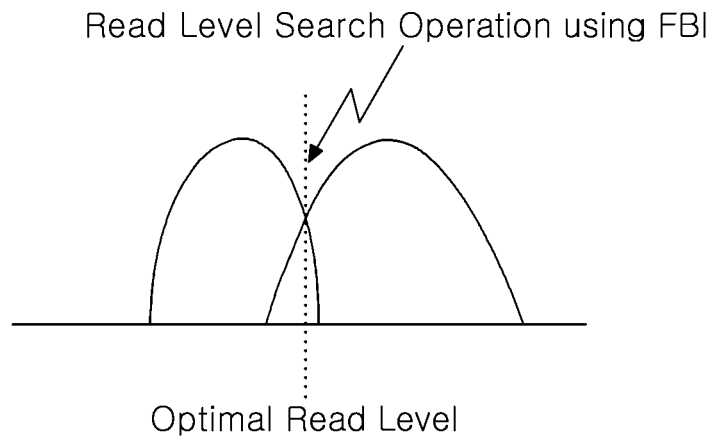
FIG. 6C
FIG. 6D
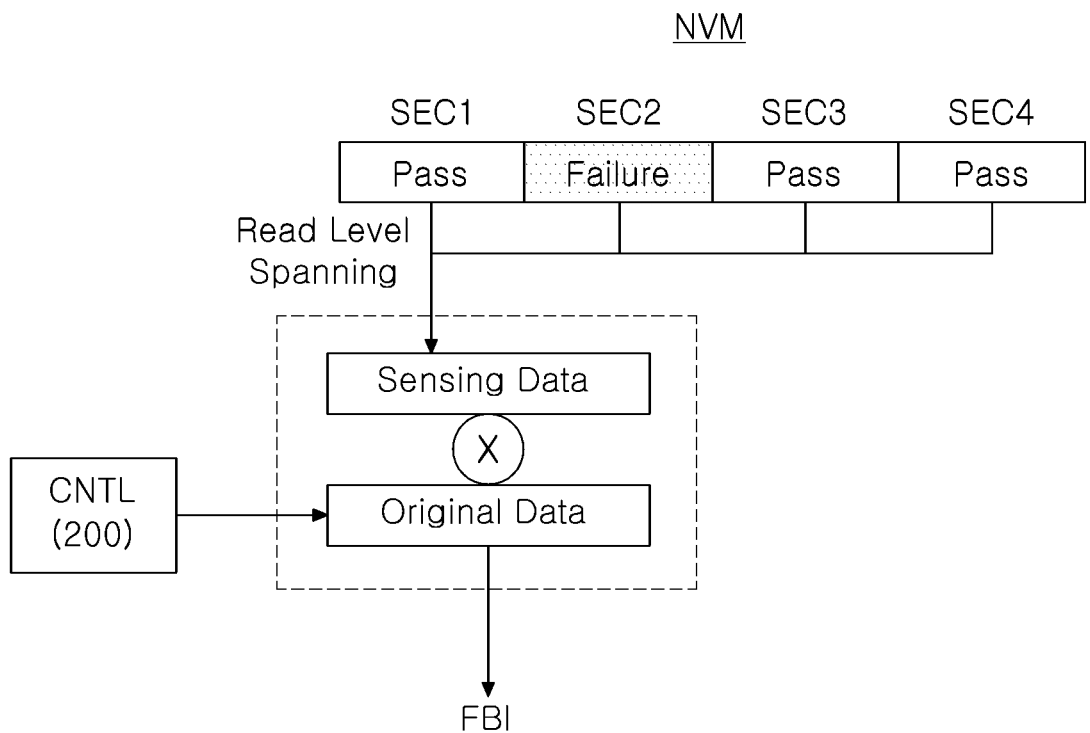
FIG. 7

NON-VOLATILE MEMORY DEVICE, CONTROLLER FOR CONTROLLING THE SAME, STORAGE DEVICE HAVING THE SAME, AND READING METHOD THEREOF

CROSS-REFERENCE TO RELATED APPLICATION(S)

This application claims the benefit of priority under 35 USC 119(a) of Korean Patent Application 10-2020-0169715 filed on Dec. 7, 2020 in the Korean Intellectual Property Office, the entire disclosure of which is incorporated herein by reference.

BACKGROUND

The present inventive concept relates to a non-volatile memory device, a controller for controlling the same, and a storage device having the same, and a reading method thereof.

In general, in a write operation, a storage device may generate an error correction code using an error correction code (ECC) circuit, and in a read operation, the storage device may correct data errors by referring to the error correction code. However, there may be cases in which the degree of deterioration in the memory cells of the storage device is so severe that correction is not possible with the ECC circuit. In this case, a read retry operation using a sensing technique different from a normal read operation has been performed.

SUMMARY

Example embodiments provide a non-volatile memory device determining a read level using fail bit information and performing a read operation using the determined read level, a controller for controlling the same, a storage device having the same, and a reading method thereof.

According to example embodiments, a non-volatile memory device includes: a memory cell array having a plurality of memory blocks having a plurality of memory cells connected to a plurality of wordlines and a plurality of bitlines; a row decoder selecting one of the plurality of memory blocks in response to an address; a voltage generator providing corresponding wordline voltages to selected wordlines and unselected wordlines among the plurality of wordlines; page buffers connected to the plurality of bitlines and reading data from memory cells connected to a selected wordline of a memory block selected from the plurality of memory blocks; and a control logic controlling the row decoder, the voltage generator, and the page buffers, in which the control logic may receive first data of at least one sector of the non-volatile memory from a controller, perform a sensing operation of first memory cells corresponding to the first data among the memory cells using a read level to obtain second data, compare the first data and second data of the sensing operation, and count a fail bit according to the comparison result.

According to example embodiments, a non-volatile memory device includes: a plurality of memory blocks including at least two strings disposed between each of the bitlines and a common source line, each of the at least two strings including at least one string select transistor connected in series between one of the bitlines and the common source line, a plurality of memory cells, and at least one ground transistor, the at least one string select transistor having a gate connected to a string select line, each of the plurality of memory cells receiving a wordline voltage from a corresponding wordline, and the at least one ground transistor having a gate connected to a ground select line; and a control logic receiving original data along with a specific command when error correction is not possible in a normal read operation, comparing sensed data with the original data while changing a read level, and generating fail bit information according to the comparison result.

According to example embodiments, a non-volatile memory device includes: a memory cell area having a first metal pad; and a memory cell array including a peripheral circuit area having a second metal pad and vertically connected to the first metal pad through the second metal pad, and a plurality of memory blocks having a plurality of memory cells connected to a plurality of wordlines and a plurality of bitlines in the memory cell area; a row decoder selecting one of the plurality of wordlines in the peripheral circuit area; a page buffer circuit having a plurality of page buffers connected to the plurality of bitlines in the peripheral circuit area; and a control logic receiving a command latch enable (CLE) signal, an address latch enable (ALE) signal, a chip enable (CE) signal, a write enable (WE) signal, a read enable (RE) signal, and a strobe signal (DQS) through control pins, in the peripheral circuit area and performing a fail bit count operation by latching a command or an address at an edge of the WE signal according to the CLE signal and the ALE signal, in which the fail bit count operation may compare original data and sensed data, and count a fail bit according to the comparison result.

According to example embodiments, a controller includes: control pins providing control signals to at least one non-volatile memory device; a buffer memory; an error correction circuit correcting an error in first read data of a first page read from the at least one non-volatile memory device according to a first read operation; and a processor driving a read level search unit of the read operation of the at least one non-volatile memory device, in which the read level search unit may receive fail bit information of a sector error-corrected in the first page from the at least one non-volatile memory device when the error correction of the first read data is not possible, and search for an optimal read level or sets a soft decision offset using the fail bit information.

According to example embodiments, a storage device includes: at least one non-volatile memory device; and a controller connected to the at least one non-volatile memory device by control pins providing a command latch enable (CLE) signal, an address latch enable (ALE) signal, a chip enable (CE) signal, a write enable (WE) signal, a read enable (RE) signal, a strobe signal (DQS) to the at least one non-volatile memory device and implemented to read data from the at least one non-volatile memory, in which the at least one non-volatile memory device may perform a fail bit count operation by latching a specific command at an edge of the WE signal according to the CLE signal and the ALE signal, and the fail bit count operation may compare sensing data and original data while changing a read level, counts a fail bit corresponding to the comparison result, and generate fail bit information according to the read level.

According to example embodiments, a reading method of a storage device having at least one non-volatile memory device and a controller for controlling the at least one non-volatile memory device includes: transmitting a first read command from the controller to the at least one non-volatile memory device; receiving, by the controller, first read data corresponding to the first read command from the at least one non-volatile memory device; transmitting error-corrected sector data from the controller to the at least one non-volatile memory device along with a specific command, when an error correction of the first read data is not possible; receiving, by the controller, fail bit information from the at least one non-volatile memory device; performing, by the controller, a read level search operation using the fail bit information; transmitting, by the controller, a read level and a second read command determined in the read level search operation to the at least one non-volatile memory device; and receiving, by the controller, second read data corresponding to the second read command from the at least one non-volatile memory device.

BRIEF DESCRIPTION OF DRAWINGS

The above and other aspects, features, and advantages of the present inventive concept will be more clearly understood from the following detailed description, taken in conjunction with the accompanying drawings, in which:

FIGS. 6A to 6D are diagrams illustrating, by way of example, a concept of the present inventive concept;

FIG. 7 is a diagram conceptually illustrating a process of generating fail bit information (FBI) in the non-volatile memory device 100 (NVM) according to the example embodiment of the present inventive concept;

DETAILED DESCRIPTION

Hereinafter, the contents of the present inventive concept will be described in detail and clearly enough to be easily implemented by those with ordinary knowledge in the technical field to which the present inventive concept pertains, using the accompanying drawings.

A non-volatile memory device according to an example embodiment of the present inventive concept, a storage device having the same, and a reading method thereof may output fail bit information (FBI) according to a read level in a corrected sector (or corrected peripheral word-in) when error correction is not possible, and derive an optimal read level using the fail bit information.

For example, the non-volatile memory device may receive original data of the corrected sector from an external controller, compare a detection result of the corrected sector according to the read level with original data, and output the fail bit information (FBI) according to the read level to a controller according to the comparison result. The controller may derive the optimal read level using the fail bit information (FBI).

The non-volatile memory device according to the example embodiment of the present inventive concept, the storage device having the same, and the reading method thereof may perform a read operation using the optimal read level that minimizes errors by deriving the read level using the fail bit information of the corrected sector.

Figure 1:
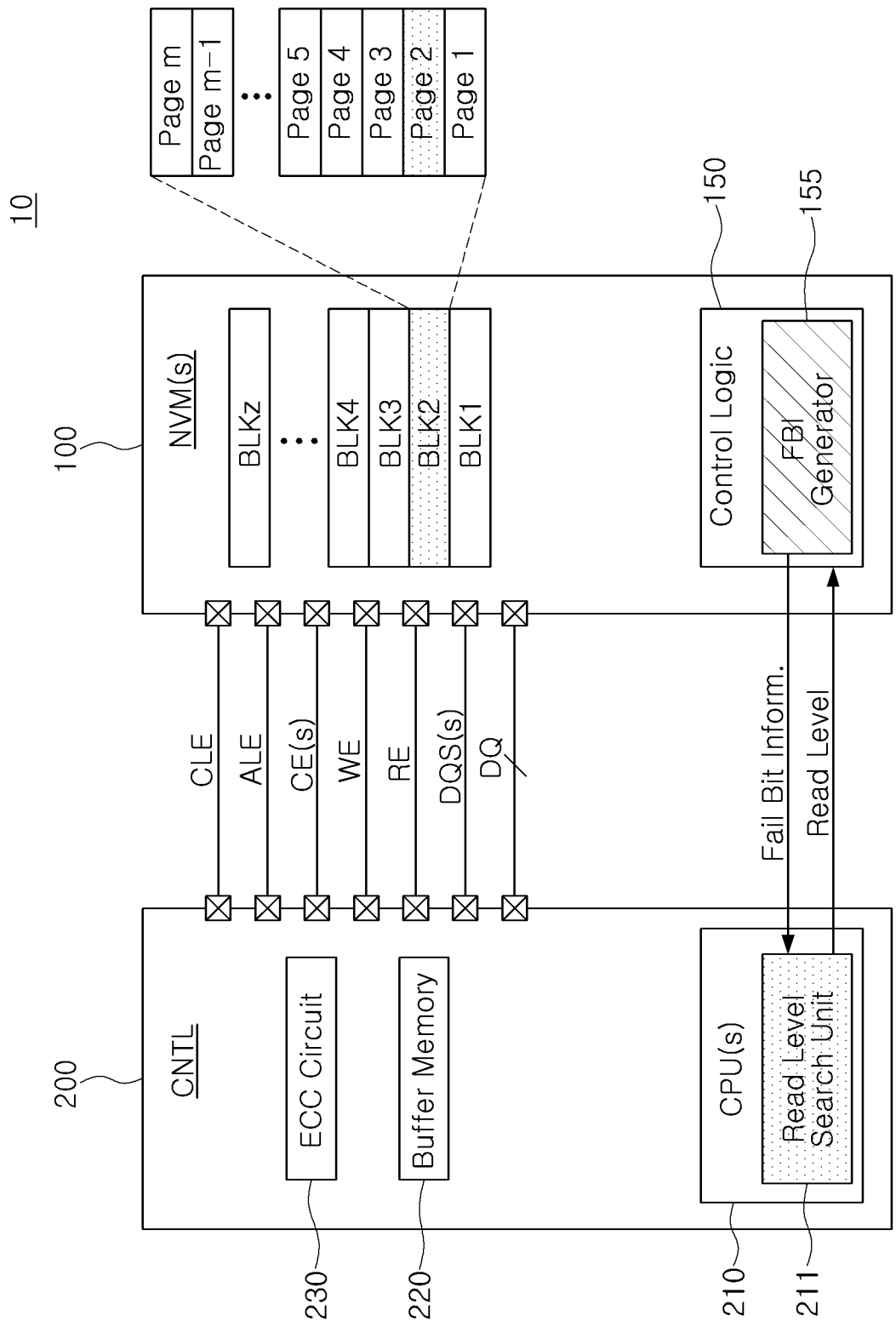
FIG. 1 is a diagram illustrating, by way of example, a storage device 10 according to an example embodiment of the present inventive concept.

FIG. 1 is a diagram illustrating, by way of example, a storage device 10 according to an example embodiment of the present inventive concept. Referring to FIG. 1, the storage device 10 may include at least one non-volatile memory device (NVM) 100 and a controller (CNTL) 200.

At least one non-volatile memory device 100 may be implemented to store data. The non-volatile memory device 100 may include a NAND flash memory, a vertical NAND flash memory, a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), and the like. In addition, the non-volatile memory device 100 may be implemented in a three-dimensional array structure. The present inventive concept may be applicable not only to a flash memory device in which a charge storage layer is constituted by a conductive floating gate, but also to a charge trap flash (CTF) in which the charge storage layer is constituted by an insulating film. In the following, for convenience of description, the non-volatile memory device 100 will be referred to as a vertical NAND flash memory device (VNAND).

In addition, the non-volatile memory device 100 may be implemented to include a plurality of memory blocks BLK1 to BLKz (z is an integer greater than or equal to 2) and a control logic 150.

Each of the plurality of memory blocks BLK1 to BLKz may include a plurality of pages Page 1 to Page m (m is an integer greater than or equal to 2). Each of the plurality of pages Page 1 to Page m may include a plurality of memory cells. Each of the plurality of memory cells may store at least one bit.

The control logic 150 may be implemented to receive a command and an address from the controller (CNTL) 200 and perform operations (program operation (i.e., write operation), read operation, erase operation, etc.) corresponding to the received command in the memory cells corresponding to the address.

In addition, the control logic 150 may include a fail bit information generator 155. The fail bit information generator 155 may be implemented to generate the fail bit information (FBI) according to the read level. For example, the fail bit information generator 155 may count a fail bit by comparing the sensed data with the original data while changing the read level in at least one error-corrected sector, and generate the counted '1' fail bit information or '0' fail bit information as the fail bit information (FBI). As used herein the term "original data" refers to data initially stored in an address of the non-volatile memory device 100. When data read (i.e., sensed data) from the address does not contain an error, the sensed data and the original data may be the same.

The controller (CNTL) 200 may be connected to at least one non-volatile memory device 100 through a plurality of control pins that transmit control signals (for example, command latch enable (CLE), address latch enable (ALE), chip enable (CE), write enable (WE), read enable (RE), etc.). In addition, the controller (CNTL) 200 may be implemented to control the non-volatile memory device 100 using the control signals (CLE, ALE, CE, WE, RE, etc.). For example, the non-volatile memory device 100 may perform a program operation/read operation/erase operation by latching a command CMD or an address ADD at an edge of a write enable (WE) signal according to a command latch enable (CLE) signal and an address latch enable (ALE) signal.

In addition, the controller 200 may include at least one processor (central processing unit (CPU) 210), a buffer memory 100, and an error correction circuit 230.

A processor 210 may be implemented to control the overall operation of the storage device 10. The CPU 210 may perform various management operations such as cache/buffer management, firmware management, garbage collection management, wear leveling management, data redundancy elimination management, read refresh/reclaim management, bad block management, multi-stream management, mapping of host data and nonvolatile memory management, quality of service (QoS) management, system resource allocation management, nonvolatile memory queue management, read level management, erase/program management, hot/cold data management, power loss protection management, dynamic thermal management, initialization management, and redundant array of inexpensive disk (RAID) management.

In particular, the processor 210 may drive a read level search unit 211 that manages the read level. The read level search unit 211 may be implemented to optimally find a read level using the fail bit information (FBI).

The buffer memory 100 may be implemented as a volatile memory (for example, a static random access memory (SRAM), a dynamic RAM (DRAM), a synchronous RAM (SDRAM), etc.) or a non-volatile memory (a flash memory, a phase-change RAM (PRAM), a magneto-resistive RAM (MRAM), a resistive RAM (ReRAM), a ferro-electric RAM (FRAM), etc.). The buffer memory 100 may include at least one pre defined table (PDT), an OVS table (OVST), and a history read level table (HRT).

The ECC circuit 230 may be implemented to generate an error correction code during a program operation and recover data DATA using an error correction code during a read operation. For example, the ECC circuit 230 may generate an error correction code (ECC) for correcting a fail bit or an error bit of the data DATA received from the non-volatile memory device 100. The ECC circuit 230 may form data DATA to which a parity bit is added by performing error correction encoding on data provided to the non-volatile memory device 100. The parity bit may be stored in the non-volatile memory device 100. In addition, the ECC circuit 230 may perform error correction decoding on the data DATA output from the non-volatile memory device 100. The ECC circuit 230 may correct an error using parity. The ECC circuit 230 may correct an error using coded modulation such as a low density parity check (LDPC) code, a Bose-Chaudhuri-Hocquenghem (BCH) code, a turbo code, a Reed-Solomon code, a convolution code, a recursive systematic code (RSC), trellis-coded modulation (TCM), and block coded modulation (BCM).

Meanwhile, when the error correction is not possible in the error correction circuit 230, a read retry operation may be performed. In an example embodiment, the read retry operation may include a read level search operation.

When an uncorrectable error correction code (UECC) occurs, the storage device 10 according to the present inventive concept may determine the optimal read level using the fail bit information (FBI) of the error-corrected sector according to the read level and perform the read retry operation using the determined optimal read level, thereby improving the reliability of the read operation.

Figure 2:
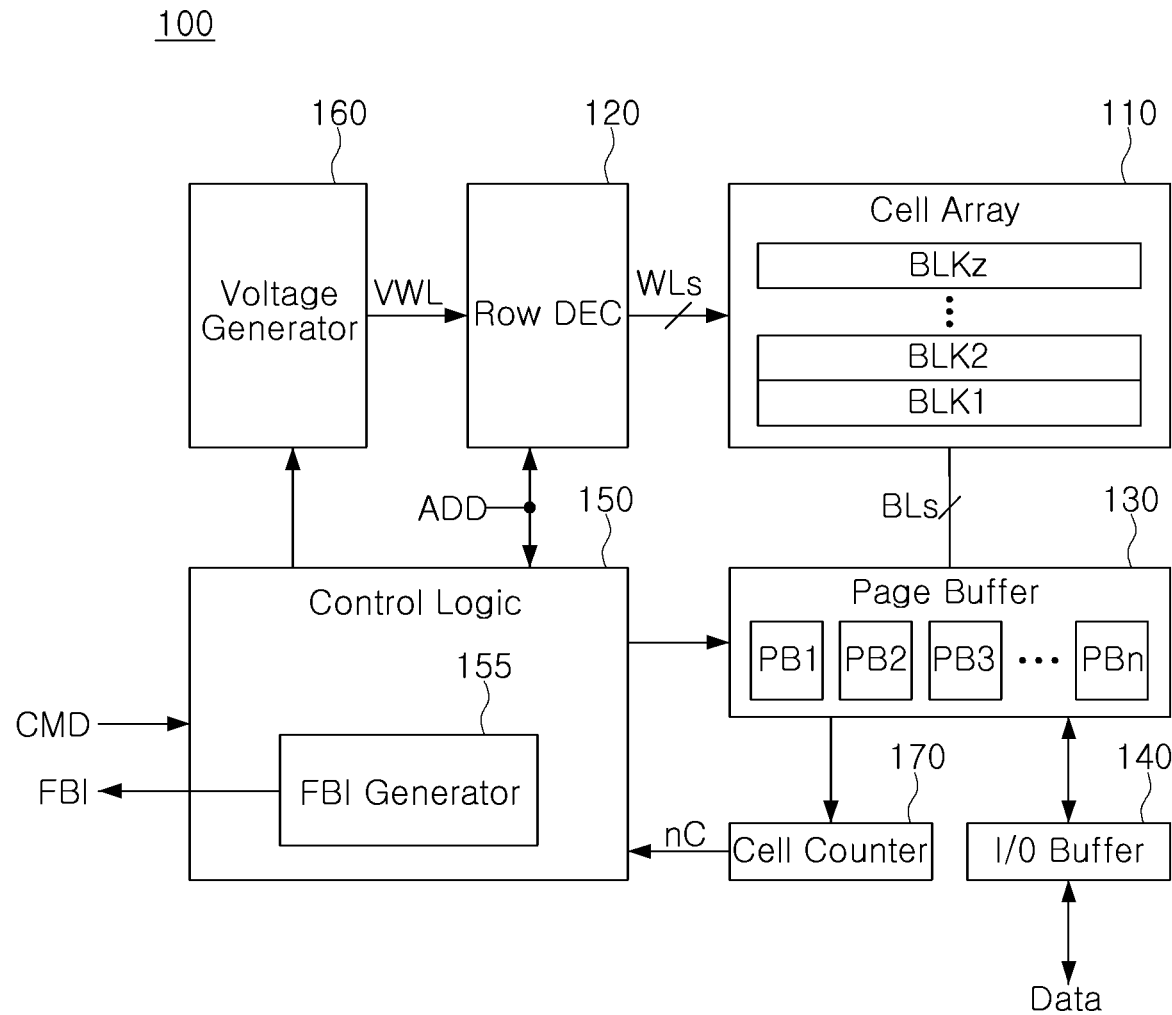
FIG. 2 is a diagram illustrating, by way of example, a non-volatile memory device 100 illustrated in FIG. 1.

FIG. 2 is a diagram illustrating, by way of example, a non-volatile memory device 100 illustrated in FIG. 1. Referring to FIG. 2, the non-volatile memory device 100 may include a memory cell array 110, a row decoder 120, a page buffer circuit 130, an input/output buffer circuit 140, a control logic 150, a voltage generator 160, and a cell counter 170.

The memory cell array 110 may be connected to the row decoder 120 through wordlines WLs or select lines SSL and GSL. The memory cell array 110 may be connected to the page buffer circuit 130 through bitlines BLs. The memory cell array 110 may include a plurality of cell strings. Each channel of the cell strings may be formed in a vertical or horizontal direction. Each of the cell strings may include a plurality of memory cells. Here, the plurality of memory cells may be programmed, erased, or read by a voltage provided to the bitlines BLs or the wordlines WLs. In general, the program operation is performed on a page basis, and the erase operation is performed on a block basis. Details of the memory cell are described in U.S. Pat. Nos. 7,679,133, 8,553,466, 8,654,587, 8,559,235, and 9,536,970, each of which is incorporated by reference herein in its entirety. In an example embodiment, a memory cell array 330 may include a 2-dimensional (2D) memory cell array, and the 2D memory cell array may include a plurality of NAND strings arranged along a row direction and a column direction.

The row decoder 120 may be implemented to select one of the memory blocks BLK1 to BLKz of the memory cell array 110 in response to the address ADD. The row decoder 120 may select one of the wordlines of the selected memory block in response to the address ADD. The row decoder 120 may transmit a wordline voltage VWL corresponding to the operation mode to the wordline of the selected memory block. During a program operation, the row decoder 120 may apply a program voltage and a verify voltage to the selected wordline, and may apply a pass voltage to the unselected wordline. During the read operation, the row decoder 120 may apply a read voltage to the selected wordline, and may apply a read pass voltage to the unselected wordline.

The page buffer circuit 130 may be implemented to operate as a write driver or a sense amplifier. During the program operation, the page buffer circuit 130 may apply a bitline voltage corresponding to data to be programmed to the bitlines of the memory cell array 110. During a read operation or a verify read operation, the page buffer circuit 130 may detect data stored in the selected memory cell through the bitline BL. Each of the plurality of page buffers PB1 to PBn (n is an integer greater than or equal to 2) included in the page buffer circuit 130 may be connected to at least one bitline.

Each of the plurality of page buffers PB1 to PBn may be implemented to perform sensing and latch for performing the read operation. For example, each of the plurality of page buffers PB1 to PBn may perform a sensing operation to identify any one state stored in the selected memory cells under the control of the control logic 150. In addition, after each of the plurality of page buffers PB1 to PBn stores data sensed through the sensing operation, any one data may be selected under the control of the control logic 150.

The input/output buffer circuit 140 provides data provided from the outside to the page buffer circuit 130. The input/output buffer circuit 140 may provide a command CMD provided from the outside to the control logic 150. The input/output buffer circuit 140 may provide an address ADD provided from the outside to the control logic 150 or the row decoder 120. In addition, the input/output buffer circuit 140 may output data sensed and latched by the page buffer circuit 130 to the outside.

The control logic 150 may be implemented to control the row decoder 120 and the page buffer circuit 130 in response to the command CMD transmitted from the outside.

In addition, the control logic 150 may include the fail bit information generator 155.

The fail bit information generator 155 may control the page buffer circuit 130 and the voltage generator 160 to obtain the fail bit information.

Also, the fail bit information generator 155 may be implemented to generate the fail bit information for '1' or '0' while changing the read level. The fail bit information generator 155 may generate the fail bit information using a count result nC provided from the cell counter 170.

Also, the fail bit information generator 155 may output the fail bit information (FBI) to the controller 200. In an example embodiment, the fail bit information generator 155 may output the fail bit information (FBI) using universal interface bus (UM) out, or may output the fail bit information (FBI) in response to a specific command (e.g., a get feature command, a status read command, etc.).

The voltage generator 160 may be implemented to generate various types of wordline voltages to be applied to each of the wordlines and a well voltage to be supplied to a bulk (e.g., well region) in which memory cells are formed under the control of the control logic 150. Wordline voltages applied to each of the wordlines may include a program voltage, a pass voltage, a read voltage, a read pass voltage, and the like.

The cell counter 170 may be implemented to count memory cells corresponding to a specific threshold voltage range from data sensed by the page buffer circuit 130. For example, the cell counter 170 may count the number of memory cells having a threshold voltage within the specific threshold voltage range by processing data sensed in each of the plurality of page buffers PB1 to PBn.

In addition, the cell counter 170 may output a cell count value by comparing the original data of the error-corrected sector with the sensed data. For example, the cell counter 170 may be implemented to perform an exclusive OR (XOR) operation on the original data of the error-corrected sector and the sensed data, count the number of '1s' which are a value obtained by the XOR operation, and output the counted value to the fail bit information generator 155.

In an example embodiment, the cell counter 170 may be implemented to count the number in which the original data of the error-corrected sector is '1' and the value obtained by XORing the original data and the sensed data is '1', and output the first counted value to the fail bit information generator 155.

In an example embodiment, the cell counter 170 may be implemented to count the number in which the original data of the error-corrected sector is '0' and the value obtained by XORing the original data and the sensed data is '1', and output the second counted value to the fail bit information generator 155.

The non-volatile memory device 100 according to the example embodiment of the present inventive concept may receive the original data of the error-corrected sector, compare the original data of the error-corrected sector with the sensed data while changing the read level, generate the fail bit information (FBI) according to the read level, and output the fail bit information (FBI) to the controller 200.

Figure 3:
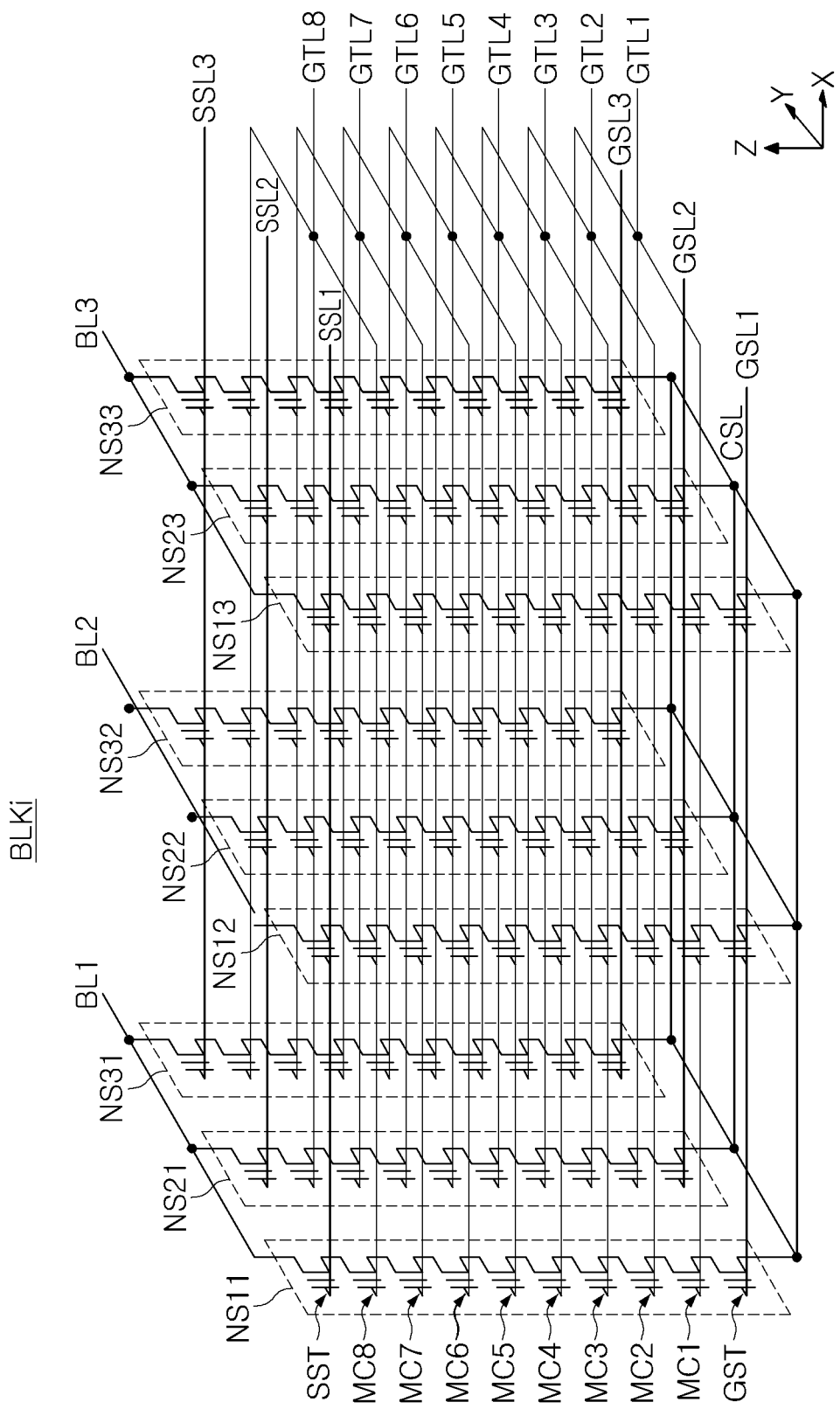
FIG. 3 is a diagram illustrating, by way of example, a circuit diagram of a memory block BLKi (i is an integer greater than or equal to 2) according to an example embodiment of the present inventive concept.

FIG. 3 is a diagram illustrating, by way of example, a circuit diagram of a memory block BLKi (i is an integer greater than or equal to 2) according to an example embodiment of the present inventive concept. A plurality of memory NAND strings included in the memory block BLKi may be formed in a direction perpendicular to the substrate.

Referring to FIG. 3, the memory block BLKi may include a plurality of memory NAND strings NS11 to NS33 connected between bitlines BL1, BL2, and BL3 and a common source line CSL. Each of the plurality of memory NAND strings NS11 to NS33 may include a string select transistor SST, a plurality of memory cells MC1, MC2, . . . , MC8, and a ground select transistor GST. FIG. 3 illustrates that each of the plurality of memory NAND strings NS11 to NS33 includes eight memory cells MC1, MC2, . . . , MC8, but is not limited thereto.

The string select transistor SST may be connected to the corresponding string select lines SSL1, SSL2, and SSL3. The plurality of memory cells MC1, MC2, . . . , MC8 may be connected to corresponding gate lines GTL1, GTL2, GTL8, respectively. The gate lines GTL1, GTL2, GTL8 may correspond to wordlines, and some of the gate lines GTL1, GTL2, GTL8 may correspond to dummy wordlines. The ground select transistor GST may be connected to the corresponding ground select lines GSL1, GSL2, and GSL3.

The string select transistor SST may be connected to the corresponding bitlines BL1, BL2, and BL3, and the ground select transistor GST may be connected to the common source line CSL.

Wordlines (e.g., WL1) having the same height are commonly connected, and the ground select lines GSL1, GSL2, and GSL3 and the string select lines SSL1, SSL2, and SSL3 may each be separated from each other. FIG. 3 illustrates that the memory block BLK is shown to be connected to eight gate lines GTL1, GTL2, GTL8 and three bitlines BL1, BL2, and BL3, but is not limited thereto.

Figure 4A:
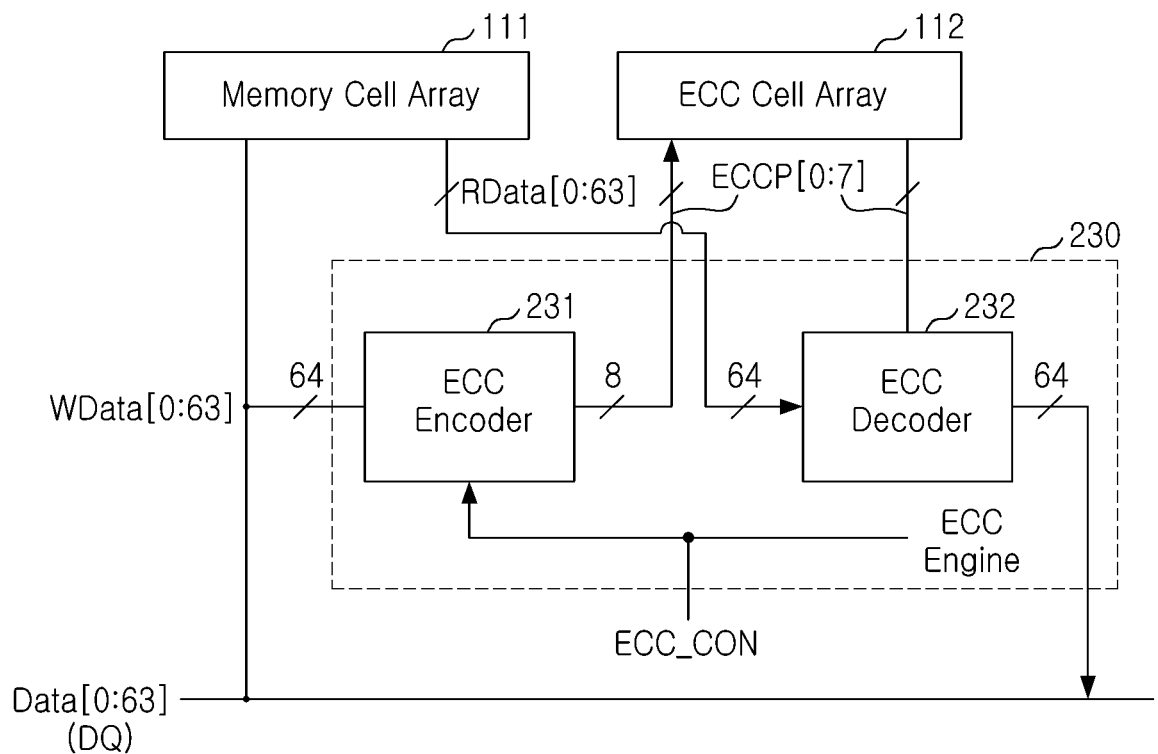
FIGS. 4A to 4C are diagrams illustrating an error correction circuit 230 of a controller 200 according to an example embodiment of the present inventive concept.
Figure 4B:
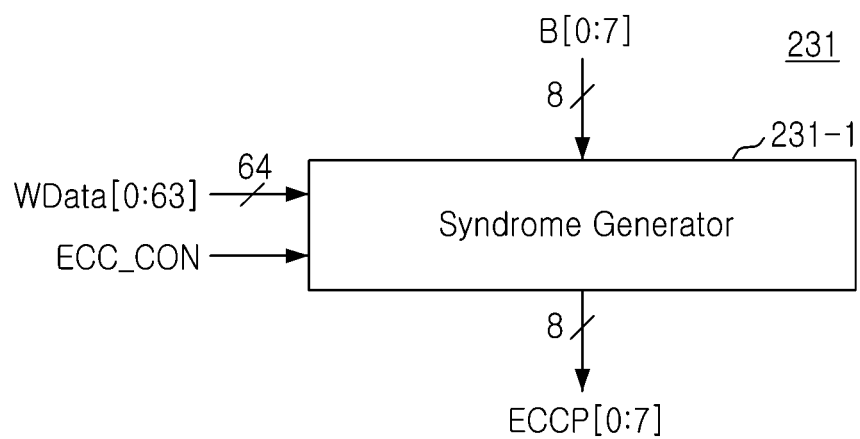
Figure 4C:
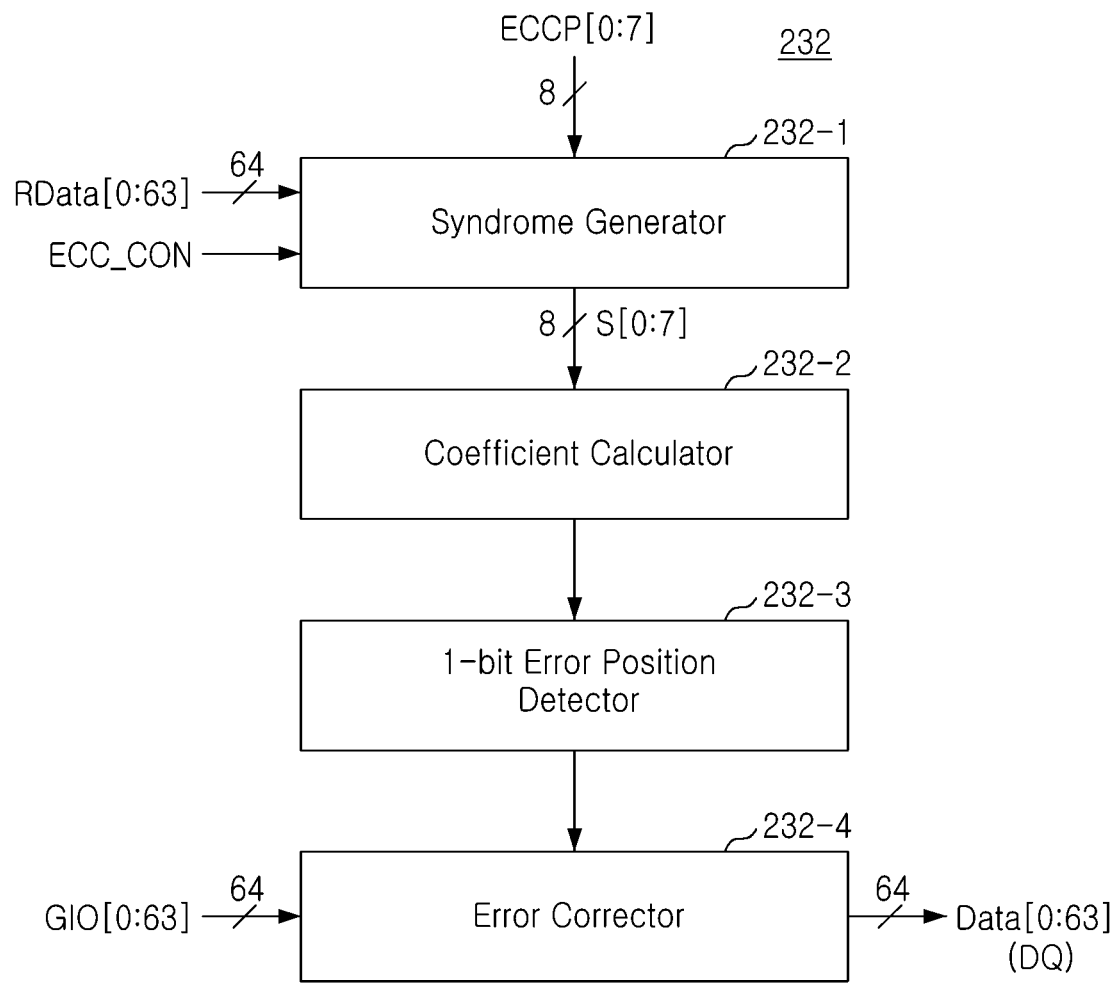

FIGS. 4A to 4C are diagrams illustrating the error correction circuit 230 of the controller 200 according to an example embodiment of the present inventive concept.

Referring to FIG. 4A, the error correction circuit 230 may include an ECC encoder 231 and an ECC decoder 232. The ECC encoder 231 may generate parity bits ECCP[0:7] for data WData[0:63] to be written in the memory cells of the memory cell array 111 in response to an ECC control signal ECC_CON. The parity bits ECCP[0:7] may be stored in the ECC cell array 112. In an example embodiment, the ECC encoder 231 may generate the parity bits ECCP[0:7] for the data WData[0:63] to be written in the memory cells including defective cells in response to the ECC control signal ECC_CON.

The ECC decoder 232 may correct error bit data using data RData[0:63] read from the memory cells of the memory cell array 111 and parity bits ECCP[0:7] read from the ECC cell array 120 in response to the ECC control signal ECC_CON and output error-corrected data Data[0:63]. In an example embodiment, the ECC decoder 232 may correct error bit data using the data RData[0:63] read from the memory cells including defective cells and the parity bits ECCP[0:7] read from the ECC cell array 120 in response to the ECC control signal ECC_CON and output the error-corrected data Data[0:63].

Referring to FIG. 4B, the ECC encoder 231 may include a syndrome generator 231-1 that receives 64-bit write data WData[0:63] and basis bits B[0:7] in response to the ECC control signal ECC_CON and uses an XOR array operation to generate the parity bits ECCP[0:7], that is, a syndrome. The basis bits B[0:7] may be bits for generating the parity bits ECCP[0:7] for the 64-bit write data WData[0:63], and may be composed of, for example, b'00000000 bits. The basis bits B[0:7] may use other specific bits instead of b'00000000 bits.

Referring to FIG. 4C, the ECC decoder 232 may include the syndrome generator 232-1, a coefficient calculator 232-2, a 1-bit error position detector 232-3, and an error corrector 232-4. The syndrome generator 232-1 may receive 64-bit read data and 8-bit parity bits ECCP[0:7] in response to the ECC control signal ECC_CON, and use the XOR array operation to generate syndrome data S[0:7]. The coefficient calculator 232-2 may calculate a coefficient of an error position equation using the syndrome data S[0:7]. Here, the error position equation is an equation based on a reciprocal of the error bit as a root. The 1-bit error position detector 232-3 may calculate a 1-bit error position using the calculated error position equation. The error corrector 232-4 may determine the 1-bit error position based on the detection result of the 1-bit error position detector 232-3. The error corrector 232-4 may correct an error by inverting a logic value of a bit in which the error occurred among the 64-bit read data RData[0:63] according to the determined 1-bit error position information, and output error-corrected 64-bit data Data[0:63].

Meanwhile, it should be understood that the size of the encoded/decoded data and the size of the parity bit illustrated in FIGS. 4A to 4C are only examples. The present inventive concept may perform an encoding/decoding operation in units of sectors.

Figure 5A:
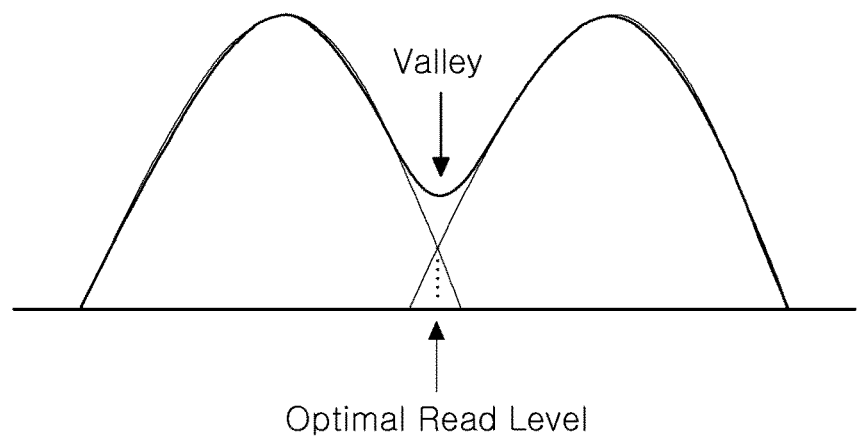
FIGS. 5A and 5B are diagrams illustrating, by way of example, an optimal read level according to a scatter shape.
Figure 5B:
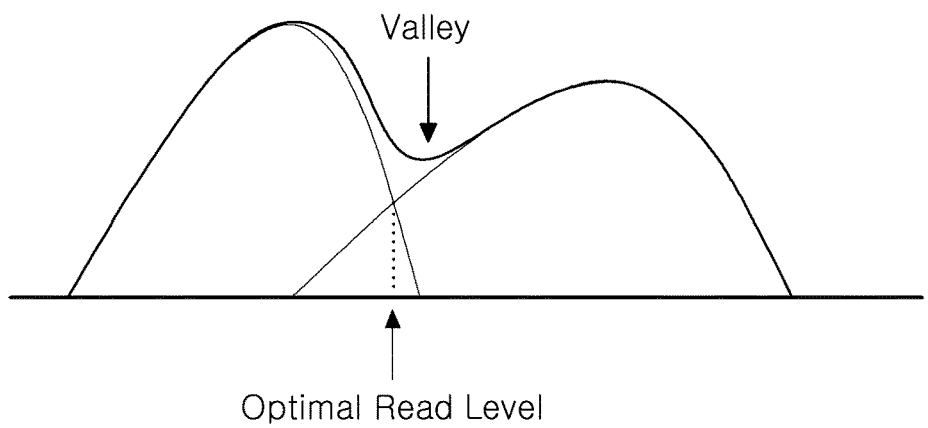

FIGS. 5A and 5B are diagrams illustrating, by way of example, an optimal read level according to a scatter shape.

As illustrated in FIG. 5A, the existing algorithms (less read estimate (LRE), minimum error search (IVIES), etc.) that find the optimal read level to minimize the error bit of the NAND flash memory are finding a minimum scatter valley based on a sum scatter of states.

As illustrated in FIG. 5B, when the shape of the scatter is asymmetric (after retention), the scatter valley of the sum scatter does not coincide with the read level that minimizes the error bit. In other words, a general read level search algorithm may adjust the read level by finding the scatter valley based on the 0/1 fail information of the corrected sector. However, when the fail bit is the same but the scatter shape is different, a case of finding an incorrect read level may occur. Therefore, the read level search operation that minimizes the error bit is required.

The storage device 10 according to the example embodiment of the present inventive concept may perform the read level search operation that minimizes the error bit using the fail bit information (FBI) of the error-corrected sector.

FIGS. 6A to 6D are diagrams illustrating, by way of example, a concept of the present inventive concept.

Figure 6A:
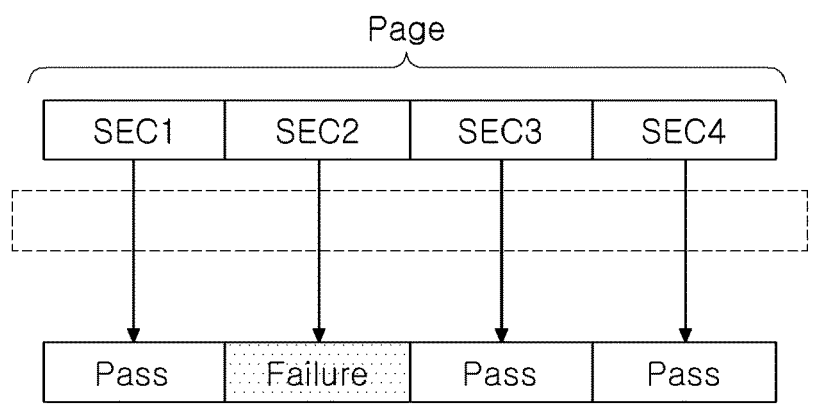

Referring to FIG. 6A, one page may include four sectors SEC1 to SEC4. Here, it should be understood that the configuration unit of the page is merely an example embodiment. The error correction circuit 230 (see FIG. 1) may perform the error correction in units of sectors. The error correction circuit 230 may determine whether each sector passes or fails. For convenience of description, it will be assumed that the first sector, the third sector, and the fourth sector SEC1, SEC3, and SEC4 have passed by the error correction circuit 230 and the second sector SEC2 has failed. In this case, in the normal read operation, since one sector is not error-correctable, UECC may occur.

Figure 6B:
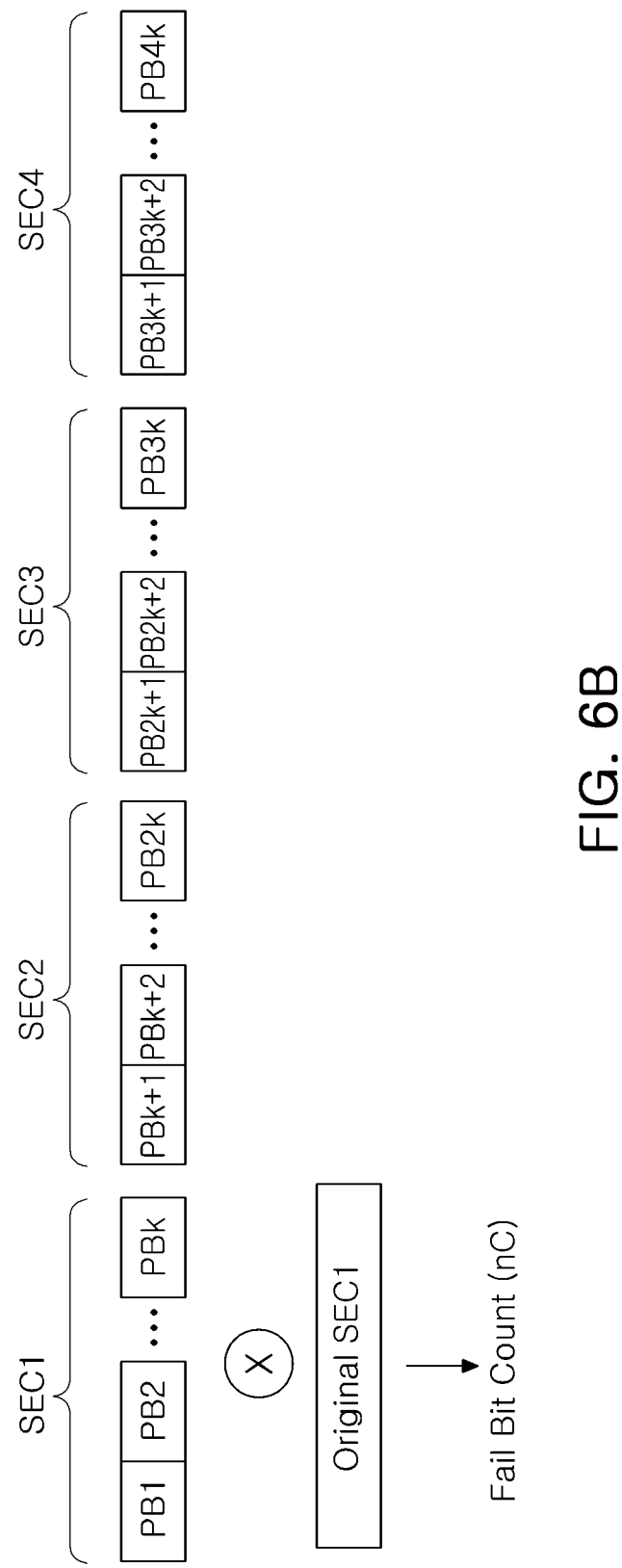

When the UECC occurs, the controller 200 (see FIG. 1) may perform the read level search operation to find the optimal read level. The controller 200 will find the optimal read level using at least one of the passed sectors SEC1, SEC3, and SEC4. As illustrated in FIG. 6B, it is assumed that the optimal read level is determined using the first sector SEC1. The controller 200 may transmit the corrected/original sector data to the non-volatile memory device 100 (see FIG. 1). The non-volatile memory device 100 may perform the sensing operation while increasing/decreasing the read level by a predetermined offset. The non-volatile memory device 100 may output the fail bit count value nC by comparing the sector data (sensing data of PB1 to PBk) according to the sensing operation with the corrected/original sector data transmitted from the controller 200. In an example embodiment, the comparison operation may include an XOR operation.

Referring to FIG. 6C, fail bit count values nC1, nC2, nCr according to read levels RL1 to RLr (r is an integer greater than or equal to 2) may be generated. The fail bit information (FBI) may include the fail bit count values nC1, nC2, nCr according to read levels RL1 to RLr.

Referring to FIG. 6D, the optimal read level may be determined using the fail bit information (FBI). For example, a read level having a minimum value among the fail bit count values nC1, nC2, nCr may be determined as an optimal read level.

The storage device 10 according to the example embodiment of the present inventive concept may set the optimal read level using the fail bit information (FBI) of the error-corrected sector when the UECC occurs.

FIG. 7 is a diagram conceptually illustrating a process of generating the fail bit information (FBI) in the non-volatile memory device 100 (NVM) according to the example embodiment of the present inventive concept. Referring to FIG. 7, the fail bit information (FBI) may be generated by performing the XOR operation on the sensed data from the memory cells corresponding to at least one of the passed sectors SEC1, SEC3, and SEC4 in the error correction and the original data transmitted from the controller (CNTL) 200 while spanning the target read level at a predetermined interval.

Figure 8A:
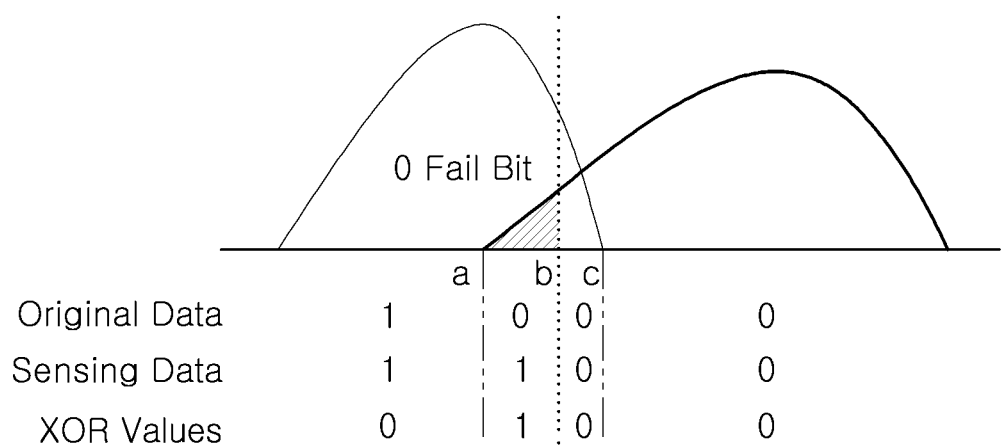
FIGS. 8A to 8C are diagrams illustrating a process of outputting fail bit information (FBI) by counting a fail bit according to a read level in the non-volatile memory device according to the example embodiment of the present inventive concept.
Figure 8B:
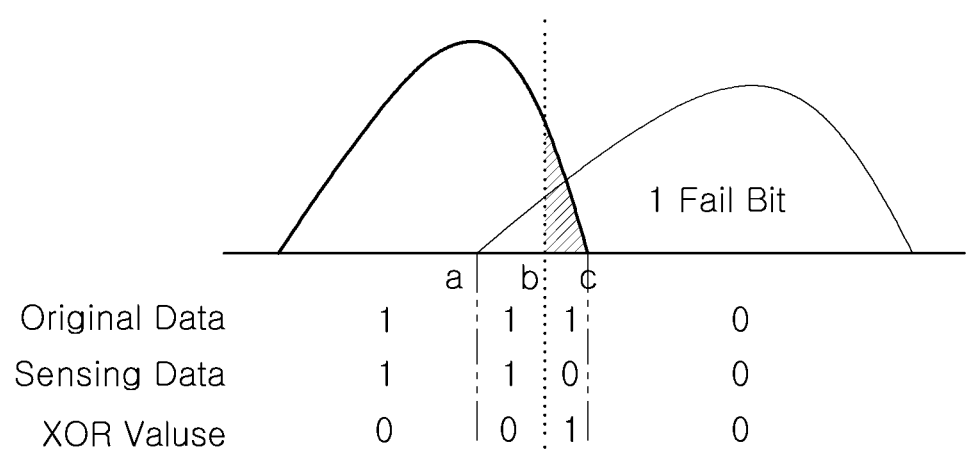
Figure 8C:
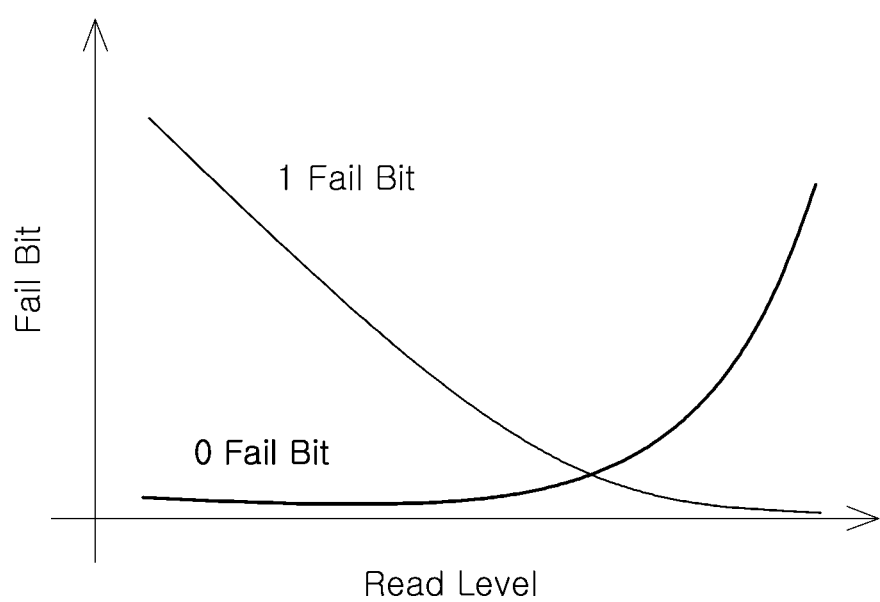

FIGS. 8A to 8C are diagrams illustrating a process of outputting fail bit information (FBI) by counting a fail bit according to a read level in the non-volatile memory device according to the example embodiment of the present inventive concept.

FIG. 8A is a diagram illustrating a process of counting a '0' fail bit by way of example. Referring to FIG. 8A, the '0' fail bit may mean a fail bit according to a leakage characteristic of an upper state. The original data may be '1' up to read level (a) where the upper state starts, and may be '0' above the read level (a). As illustrated in FIG. 8A, the sensing data may be '1' up to read level (b), and may be '0' above the read level (b). Therefore, the XOR operation value may be '1' in the interval between the read level (a) and the read level (b). The value obtained by counting the XOR operation values in the corresponding sector interval may be the '0' fail bit count value.

FIG. 8B is a diagram illustrating a process of counting a '1' fail bit by way of example. Referring to FIG. 8B, the '1' fail bit may mean a fail bit according to a retention characteristic of a lower state. The original data may be '1' up to read level (c) where the upper state ends, and may be '0' above the read level (c). As illustrated in FIG. 8B, the sensing data may be '1' up to the read level (b), and may be '0' above the read level (b). Therefore, the XOR operation value may be '1' in the interval between the read level (b) and the read level (c). The value obtained by counting the XOR operation values in the corresponding sector interval may be the '1' fail bit count value.

FIG. 8C is a diagram illustrating, by way of example, outputs of the '0' fail bit count value and the '1' fail bit count value according to the read level. Referring to FIG. 8C, the '0' fail bit may increase as the read level increases, and the '1' fail bit may decrease as the read level increases.

On the other hand, in the case of a multi level cell (MLC), a triple level cell (TLC), a quadruple level cell (QLC), etc., the controller (CNTL) may transmit the original data encoded based on the state to find the optimal read level to the non-volatile memory device (NVM).

Figure 9A:
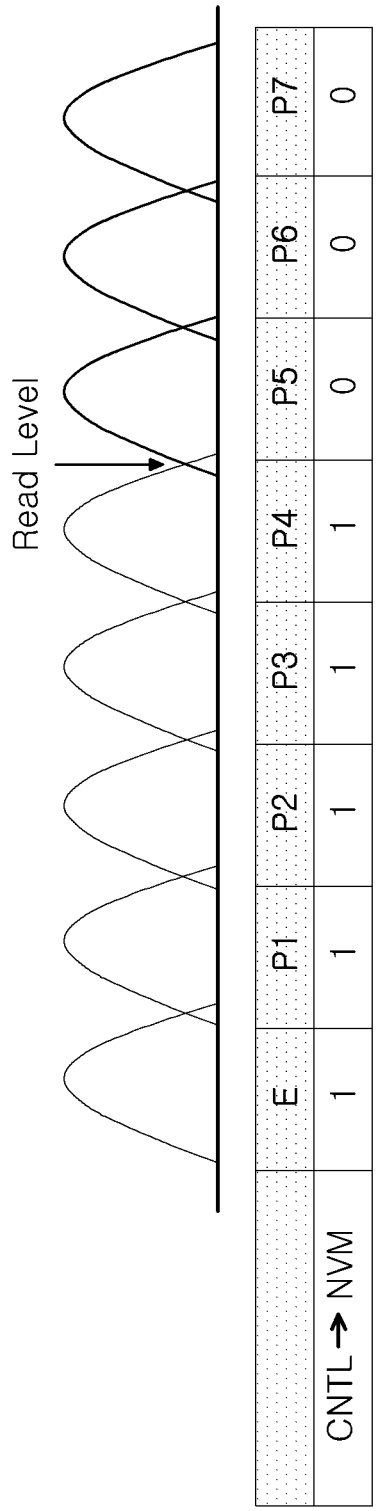
FIGS. 9A and 9B are diagrams illustrating, by way of example, a method of inputting original data based on a state in an error-corrected area.
Figure 9B:
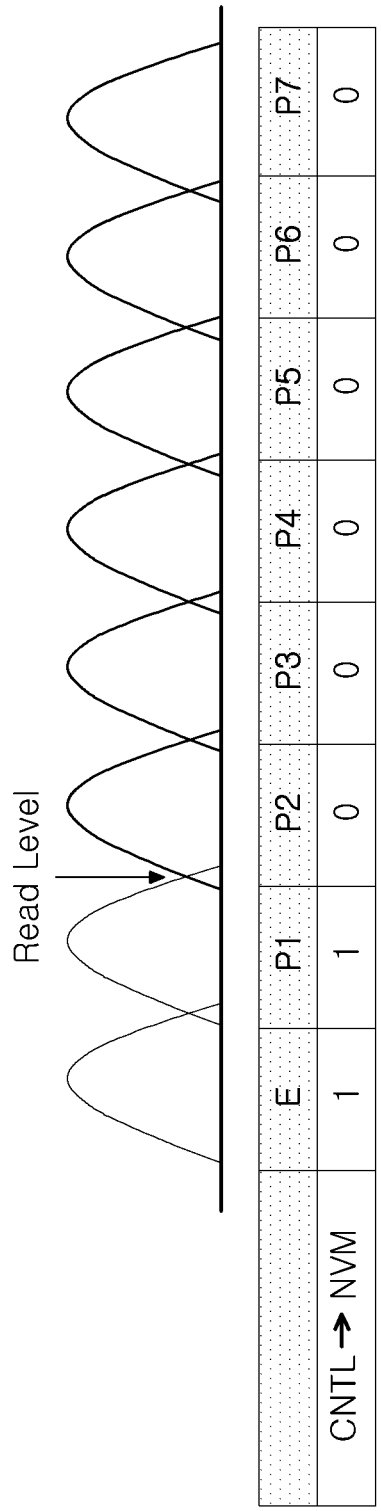

FIGS. 9A and 9B are diagrams illustrating, by way of example, a method of inputting original data based on a state in an error-corrected area.

Referring to FIG. 9A, a '1' bit may be input to the non-volatile memory device (NVM) for original data corresponding to lower states E and P1 to P4 based on a first target read level, and a '0' bit may be input to the non-volatile memory device (NVM) for original data corresponding to upper states P5 to P7.

Referring to FIG. 9B, a '1' bit may be input to the non-volatile memory device (NVM) for the original data corresponding to the lower states E and P1 based on a second target read level, and a '0' bit may be input to the non-volatile memory device (NVM) for the original data corresponding to the upper states P2 to P7.

In an example embodiment, original data input in a '0' fail bit count operation for a specific read level and original data input in a '1' fail bit count operation for a specific read level may be different.

Figure 10:
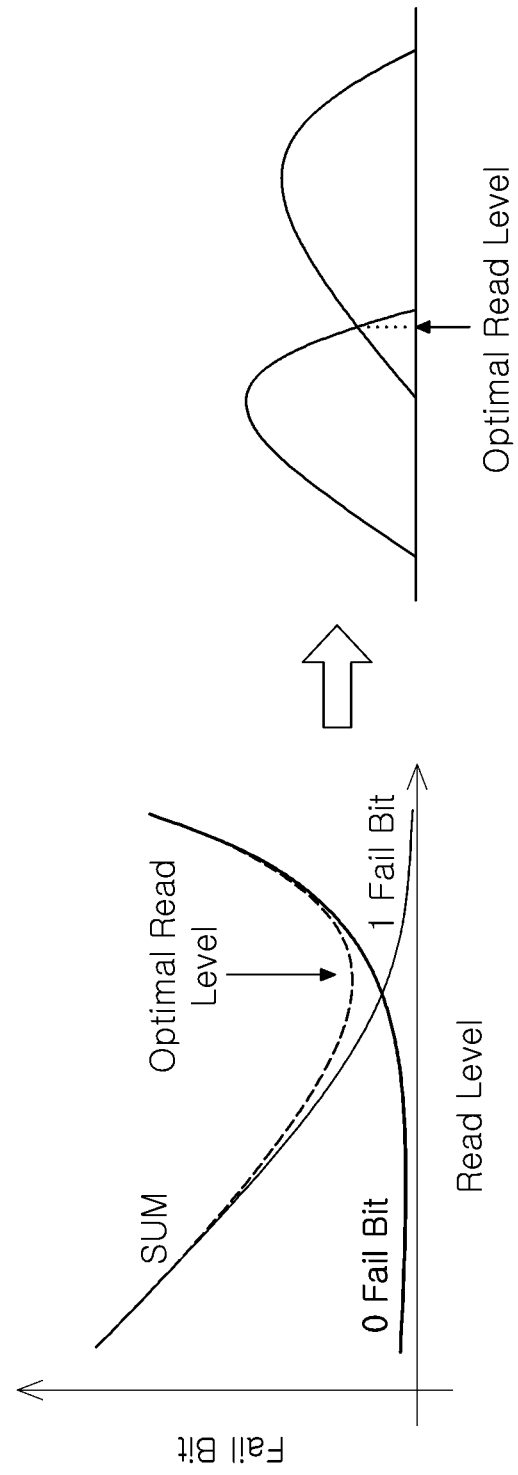
FIG. 10 is a diagram illustrating a process of finding an optimal read level using the fail bit information of the error-corrected area according to the example embodiment of the present inventive concept.

FIG. 10 is a diagram illustrating a process of finding an optimal read level using the fail bit information of the error-corrected area according to the example embodiment of the present inventive concept.

Referring to FIG. 10, a process of determining an optimal read level using fail bit information (FBI) of a corrected area may be as follows. The read level at which the sum of the '0' fail bit and the '1' fail bit becomes minimum using the fail bit information (FBI) according to the read level obtained from the corrected sector/surrounding wordline may be applied to the fail sector as the optimal read level.

Figure 11:
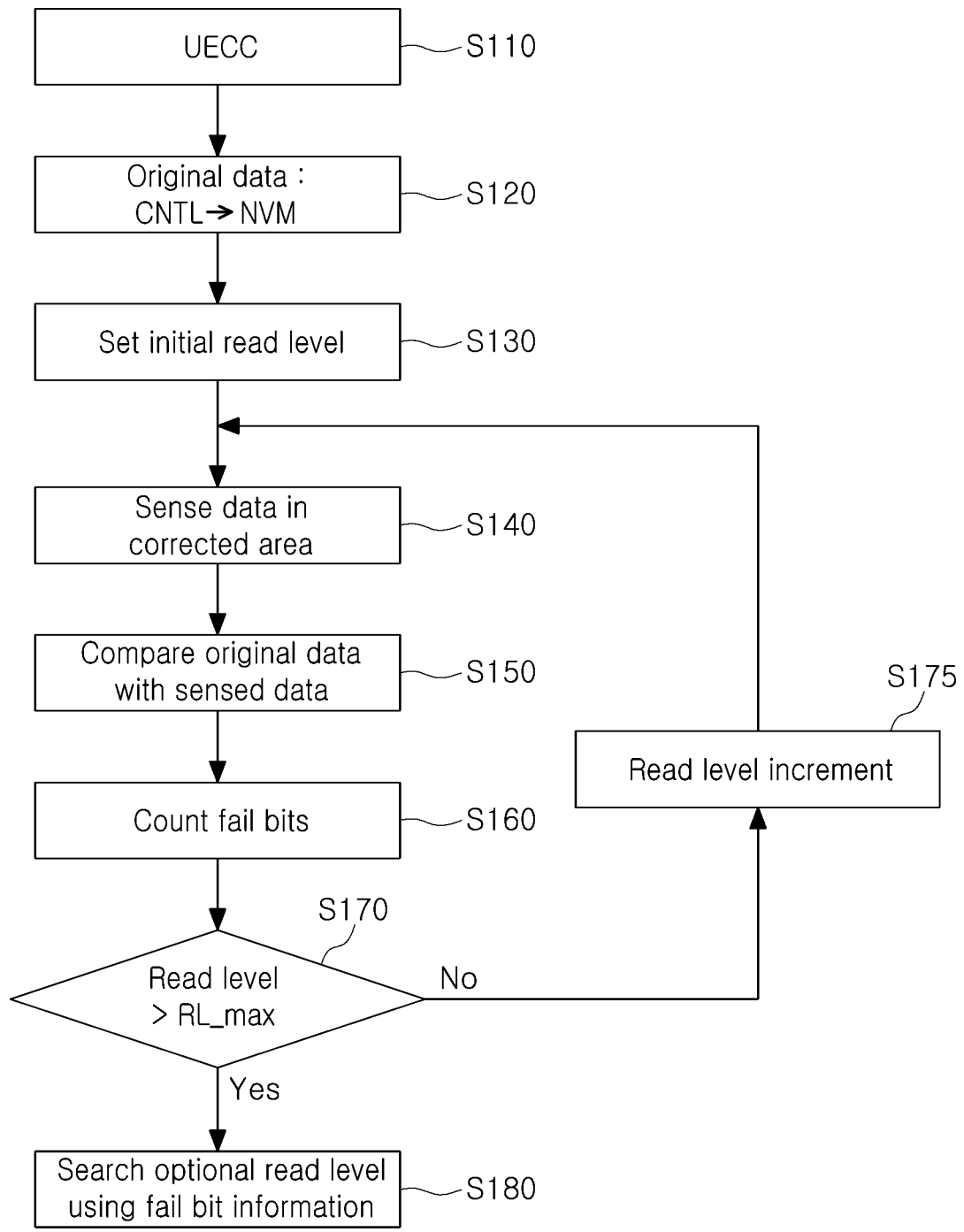
FIG. 11 is a flowchart illustrating, by way of example, a reading method of a storage device 10 according to an example embodiment of the present inventive concept.

FIG. 11 is a flowchart illustrating, by way of example, a reading method of a storage device 10 according to an example embodiment of the present inventive concept. Referring to FIGS. 1 to 11, the read operation of the storage device 10 may be performed as follows.

A read request may be received from a host (outside) to the storage device 10. The storage device 10 may perform a read operation for such a read request. The UECC (uncorrectable error correction) may occur as a result of the read operation (S110). The controller (CNTL, see FIG. 1) may encode the original data corresponding to the error-corrected sector as data for performing a read level search operation, and output the encoded original data to the non-volatile memory device (NVM, see FIG. 1) along with the read level search request (S120). The non-volatile memory device (NVM) may set an initial read level to find the optimal read level according to the read level search request from the controller (CNTL) (S130). The non-volatile memory device (NVM) may sense data of the error-corrected sector using the set read level (S140). Thereafter, the non-volatile memory device (NVM) may compare the original data and the sensed data to find the fail bit (S150). Thereafter, the non-volatile memory device (NVM) may count the fail bit as the comparison result (S160). Thereafter, the non-volatile memory device (NVM) may determine whether the current read level is greater than a maximum value RL_max (S170). When the read level is not greater than the maximum value RL_max, the read level increases by an offset determined in the event (S175), and the sensing operation may be performed again using the increased read level (S140). On the other hand, when the read level is greater than the maximum value RL_max, the optimal read level may be searched using the fail bit information (FBI). For example, a read level corresponding to a point at which the sum of the '0' fail bit count value and the '1' fail bit count value becomes minimum may be the optimal read level (S180).

On the other hand, the storage device 10 according to the example embodiment of the present inventive concept may be used to find an optimal soft decision offset using the fail bit information (FBI) of the error-corrected area.

Figure 12A:
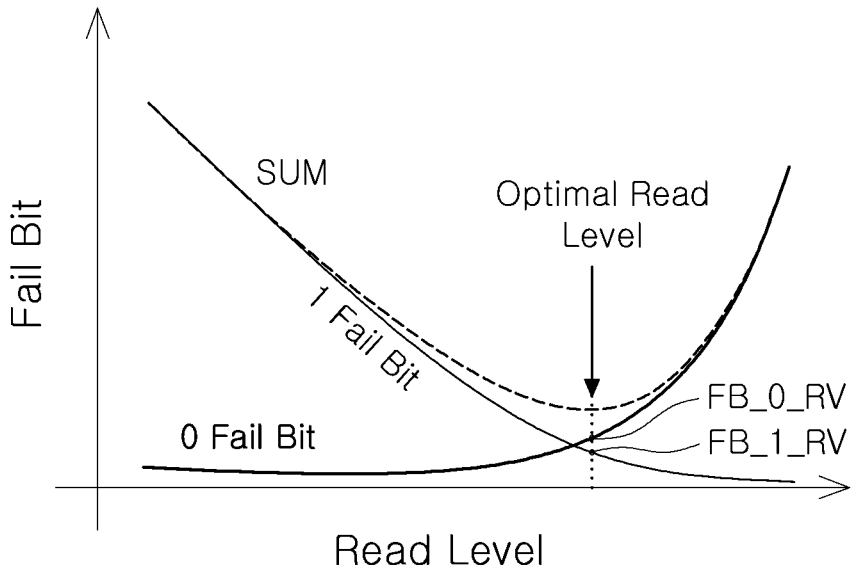
FIGS. 12A to 12C are diagrams illustrating, by way of example, a process of finding a soft decision offset according to an example embodiment of the present inventive concept.
Figure 12B:
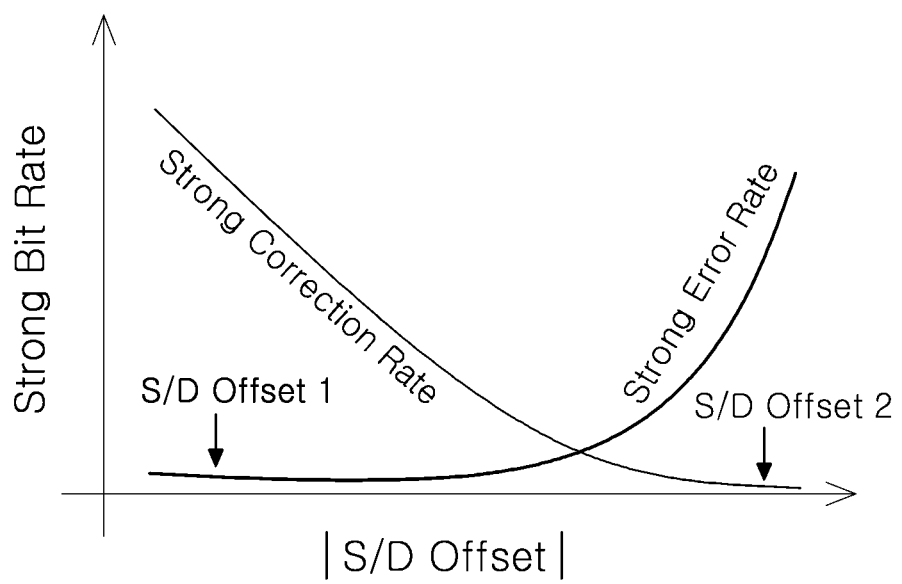
Figure 12C:
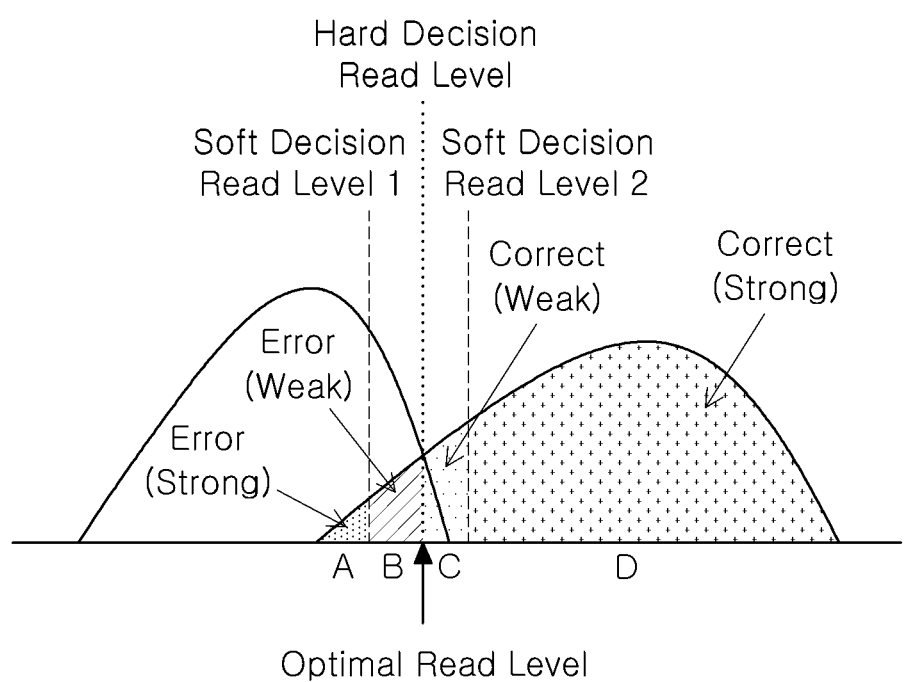

FIGS. 12A to 12C are diagrams illustrating, by way of example, a process of finding a soft decision offset according to an example embodiment of the present inventive concept.

An LDPC decoder may perform decoding under the assumption that there are few errors in strong bits. When the number of errors is the same, the lower the strong error rate and the higher the strong correction rate, the better the error correction capability. An offset level having an optimal strong/weak rate may be determined and applied to a fail sector through the fail bit information (FBI) of the corrected area.

FIG. 12A is a diagram illustrating a result of the fail bit information (FBI) output from the corrected sector. The optimal read level may be determined at the point where the sum of the '0' fail bit and the '1' fail bit becomes minimum. The '0' fail bit corresponding to the optimal read level is called an optimal '0' fail bit FB_0_RV, and the '1' fail bit corresponding to the optimal read level is called an optimal '1' fail bit FB_1_RV.

FIG. 12B is a diagram illustrating a process of deriving the strong bit rate through the fail bit information (FBI).

Referring to FIG. 12B, a process of deriving the strong bit rate using the fail bit information (FBI) for each read level may be as follows.

The strong error rate may be a value obtained by dividing the '0' fail bit by the optimal '0' fail bit FB_0_RV (0 fail bit/FB_0_RV).

The strong correction rate may be a value obtained by dividing a value obtained by subtracting the '0' fail bit from all the bits of the state (state total bit −0 fail bit) by a value obtained by subtracting the optimal '0' fail bit FB_0_RV from all the bits of the state (state total bit −FB_0_RV).

FIG. 12C is a diagram illustrating the optimal soft decision offset applied to the fail sector. Referring to FIG. 12C, a strong error area A, a weak error area B, a weak correction area C, and a strong correction area D exist in the upper state.

The storage device 10 according to the example embodiment of the present inventive concept may find the soft decision offset level having the optimal strong/weak rate using the fail bit information (FBI) and apply the determined decision offset level to the fail area, thereby improving the LDPC correction capability.

Figure 13:
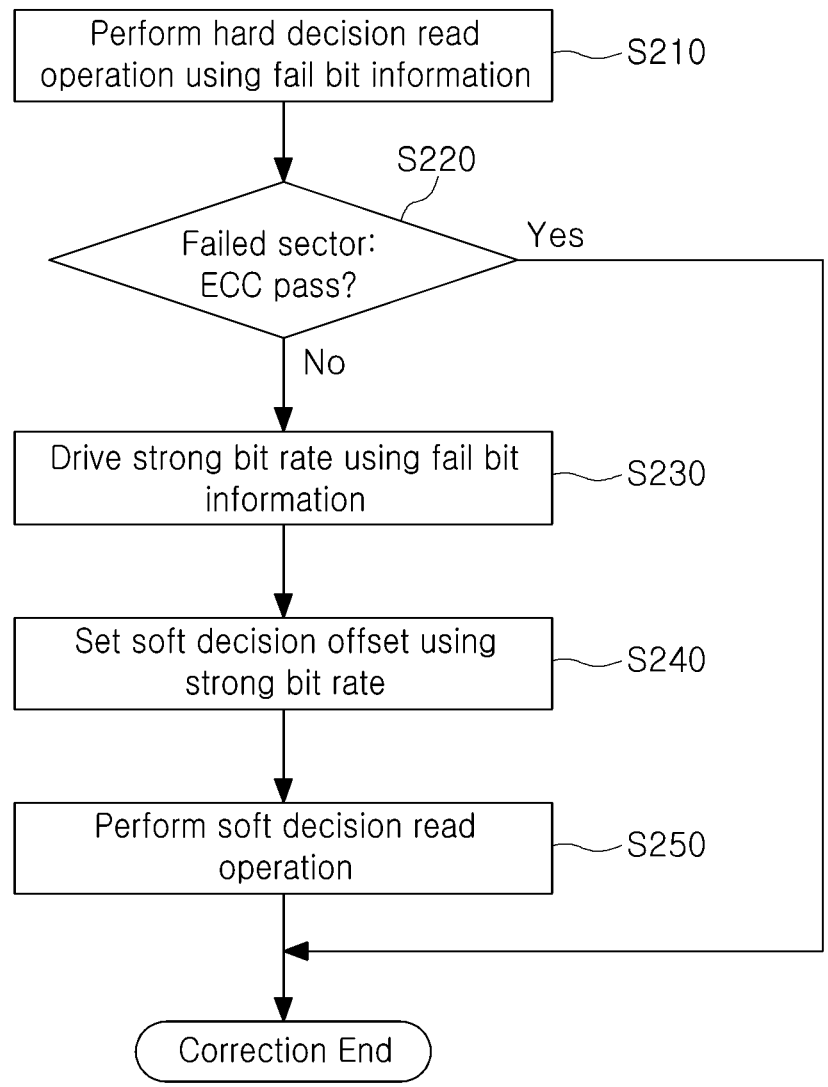
FIG. 13 is a flowchart illustrating, by way of example, a reading method of a storage device 10 according to another example embodiment of the present inventive concept.

FIG. 13 is a flowchart illustrating, by way of example, a reading method of a storage device 10 according to another example embodiment of the present inventive concept. Referring to FIGS. 1 to 13, the read operation of the storage device 10 may be performed as follows.

As illustrated in FIGS. 10 to 11, the optimal read level may be determined using the fail bit information (FBI), and a hard decision read operation for the fail sector may be performed using the determined optimal read level (S210).

It may be determined whether the ECC for the fail sector according to the hard decision read operation is a pass (S220). When the hard decision read operation fails, in order to perform a soft decision read operation, the strong bit rate may be derived using the fail bit information (FBI) according to the read level (S230). Thereafter, the strong decision offset having the predetermined strong bit rate may be set (S240). Thereafter, the soft decision read operation for the fail sector may be performed using the set strong decision offset (S250). When the hard decision read operation passes, the correction operation may be completed.

Figure 14:
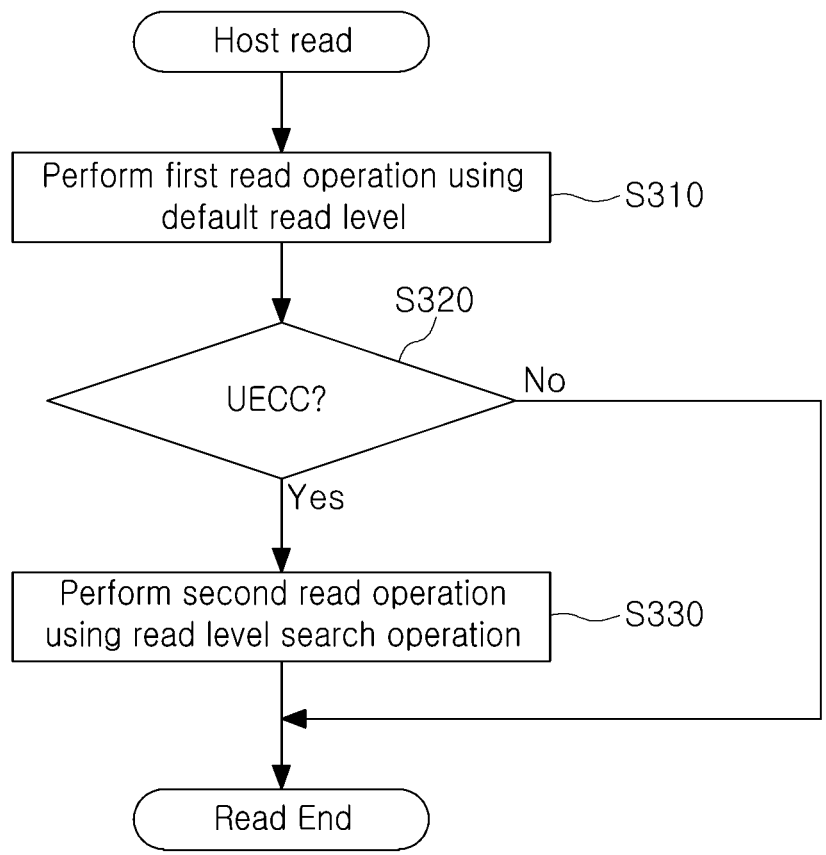
FIG. 14 is a flowchart illustrating, by way of example, a reading method of a storage device 10 according to still another example embodiment of the present inventive concept.

FIG. 14 is a flowchart illustrating, by way of example, a reading method of a storage device 10 according to still another example embodiment of the present inventive concept. Referring to FIGS. 1 to 14, the read operation of the storage device 10 may be performed as follows.

The non-volatile memory device 100 (see FIG. 1, NVM) may perform a first read operation using a default read level (S310). Here, the information corresponding to the default read level may be transmitted from the controller 200 (see FIG. 1, CNTL) along with the normal read command. The controller 200 may determine whether the UECC occurs as a result of the first read operation (S320). When the UECC does not occur, the read operation may be completed.

On the other hand, when the UECC has occurred, the non-volatile memory device 100 may perform a second read operation using the read level search operation in response to a read retry command transmitted from the controller 200. Here, as described with reference to FIGS. 1 to 13, the read level search operation may determine the optimal read level or the soft decision offset using the fail bit information (FBI) of the error-corrected sector, perform the hard decision read operation using the optimal read level, or perform the soft decision read operation using the soft decision offset (S330). As a result, the read operation may be completed.

Figure 15:
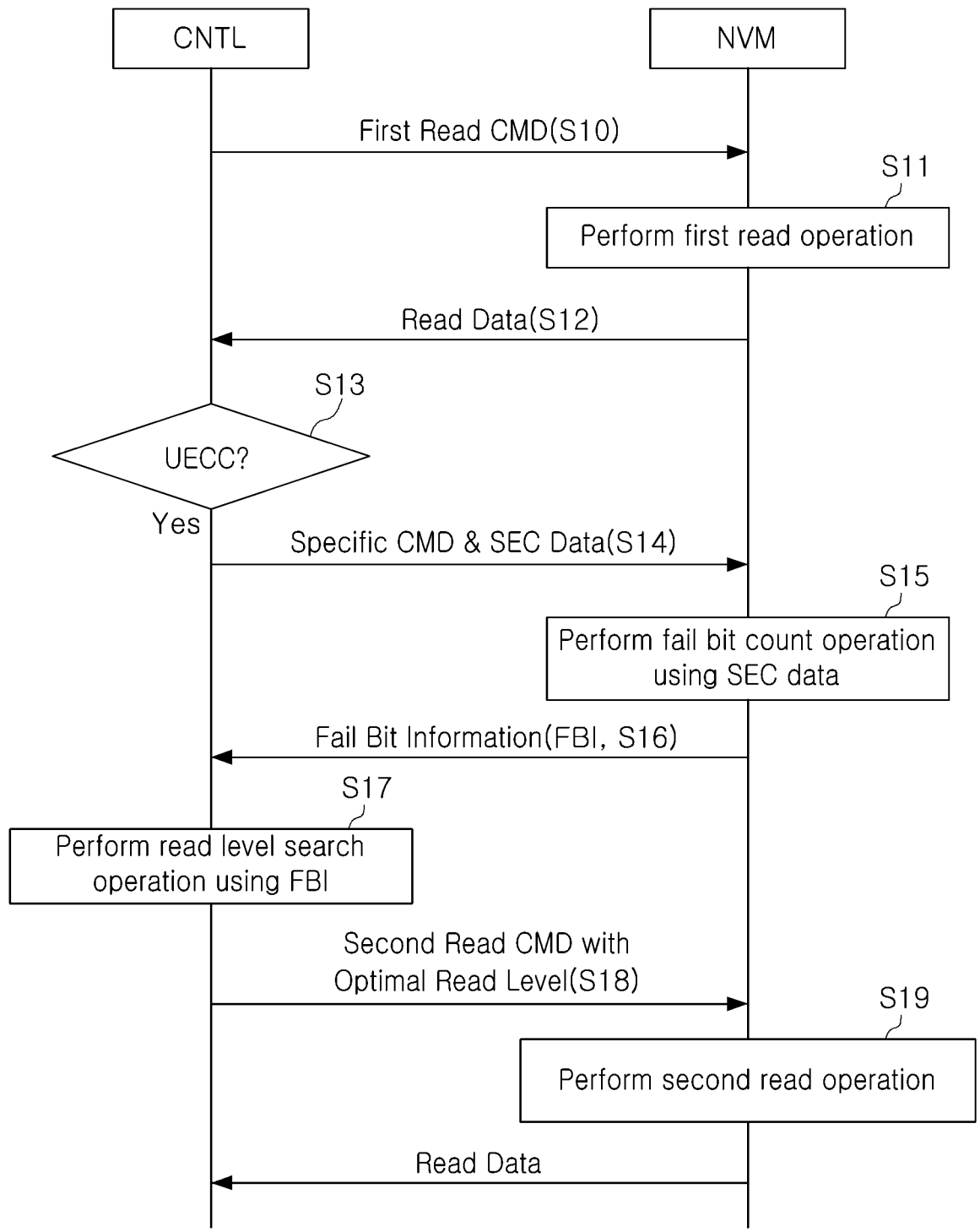
FIG. 15 is a ladder diagram illustrating, by way of example, a defense code process of a storage device 10 according to an example embodiment of the present inventive concept.

FIG. 15 is a ladder diagram illustrating, by way of example, a defense code process of a storage device 10 according to an example embodiment of the present inventive concept. Referring to FIGS. 1 to 15, the defense code process of the storage device 10 may be performed as follows.

The controller (CNTL) may transmit a first read command to the non-volatile memory device (NVM) (S10). The non-volatile memory device (NVM) may perform the first read operation in response to the first read command (S11). The data read by the first read operation may be transmitted to the controller (CNTL) (S12). The controller (CNTL) may determine whether the read data is error-correctable (S13). When the UECC has occurred, the controller (CNTL) may transmit the specific command and original data of the error-corrected sector to the non-volatile memory device (NVM) (S14).

The non-volatile memory device (NVM) may perform a fail bit count operation using sector data in response to the specific command (S15). Here, the fail bit count operation may mean sensing data from the memory cells corresponding to the error-corrected sector while changing the read level, comparing the sensed data with the original sector data, performing the error bit count according to the comparison result, and generating the fail bit information (FBI) having the error bit count values for each read level. The non-volatile memory device (NVM) may output the fail bit information (FBI) to the controller (CNTL) (S16).

Thereafter, the controller (CNTL) may perform the read level search operation using the fail bit information (FBI) (S17). The read level search operation may find the optimal read level using the fail bit information (FBI). Thereafter, the controller (CNTL) may transmit a second read command to the non-volatile memory device (NVM) along with the optimal read level for the fail sector (S18). The non-volatile memory device (NVM) may perform the second read operation using the optimal read level in response to the second read command (S19). The data read by the second read operation may be output to the controller (CNTL).

Figure 16:
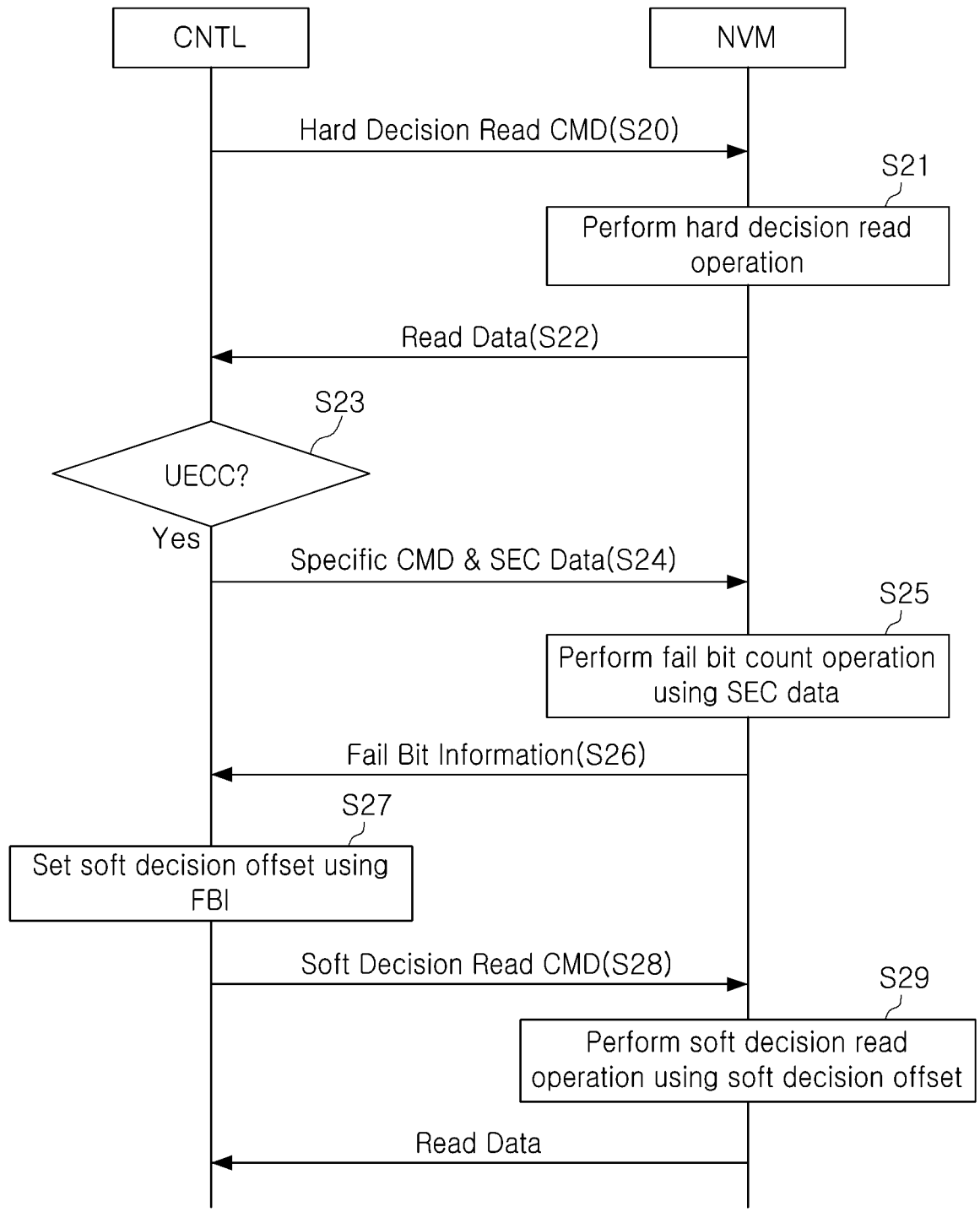
FIG. 16 is a ladder diagram illustrating, by way of example, a defense code process of a storage device 10 according to another example embodiment of the present inventive concept.

FIG. 16 is a ladder diagram illustrating, by way of example, a defense code process of a storage device 10 according to another example embodiment of the present inventive concept. Referring to FIGS. 1 to 16, the defense code process of the storage device 10 may be performed as follows.

The controller (CNTL) may transmit a hard decision read command to the non-volatile memory device (NVM) (S20). The non-volatile memory device (NVM) may perform the hard decision read operation in response to the hard decision read command (S21). Here, the hard decision read operation may be performed using a default read level, a read level determined in an on-chip valley search operation, or the optimal read level determined in the read level search operation described in FIGS. 1 to 15. Thereafter, the data read by the hard decision read operation may be transmitted to the controller (CNTL) (S22). The controller (CNTL) may determine whether the read data is error-correctable (S23). When the UECC has occurred, the controller (CNTL) may transmit the specific command and the original data of the error-corrected sector to the non-volatile memory device (NVM) (S24). A hard decision read command may utilize a decoding scheme in which hard bit (binary) information ('1's and '0's) are used to detect and correct errors.

The non-volatile memory device (NVM) may perform the fail bit count operation using the sector data in response to the specific command (S25). The non-volatile memory device (NVM) may output the fail bit information (FBI) to the controller (CNTL) (S26).

Thereafter, the controller (CNTL) may set the soft decision offset using the fail bit information (FBI) (S27). Thereafter, the controller (CNTL) may transmit a soft decision read command for the fail sector to the non-volatile memory device (NVM) (S28). The non-volatile memory device (NVM) may perform the soft decision read operation in response to the soft decision read command (S29). The data read by the soft decision read operation may be output to the controller (CNTL).

Meanwhile, the read level search operation according to the example embodiment of the present inventive concept may be performed in the non-volatile memory device (NVM).

Figure 17:
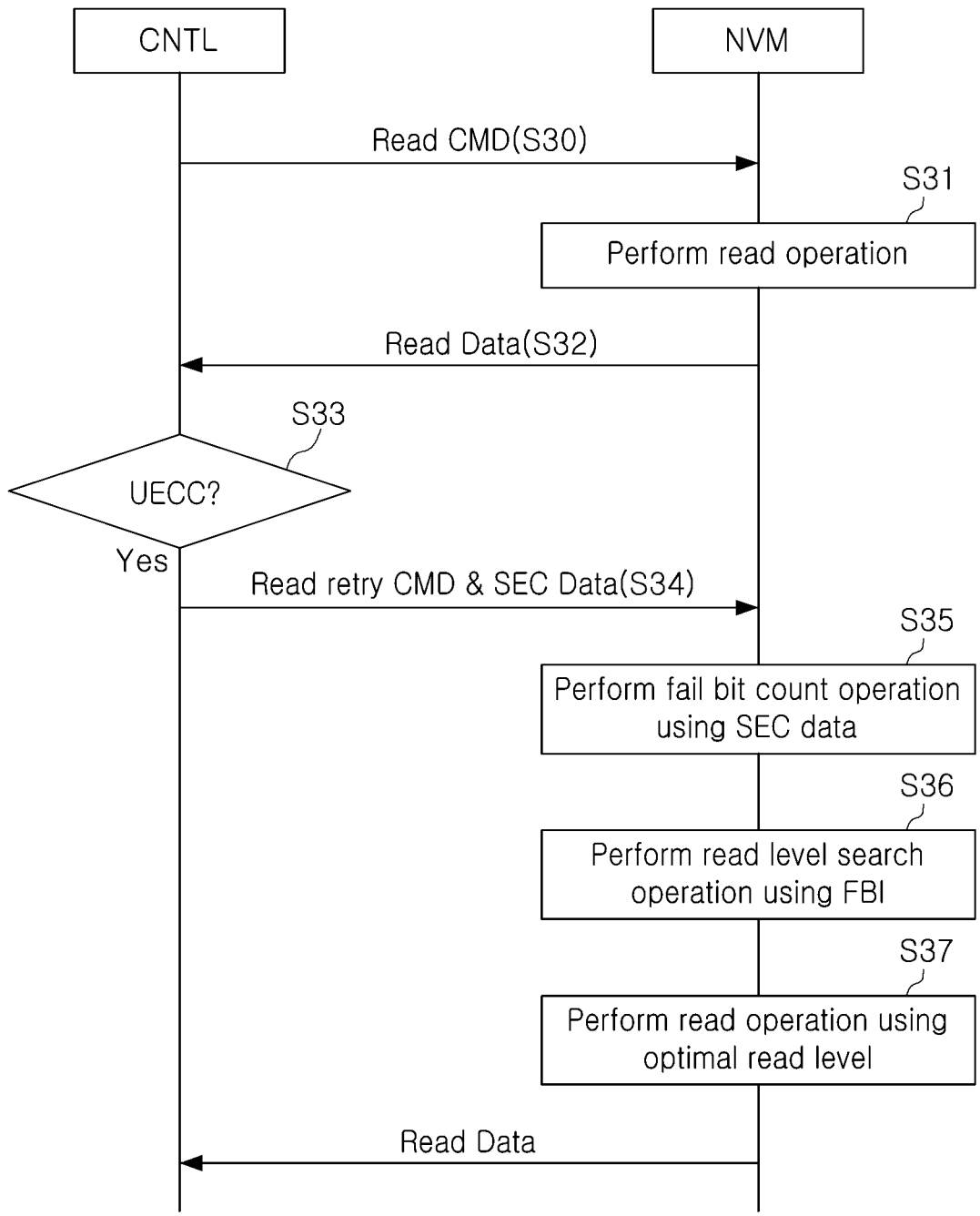
FIG. 17 is a ladder diagram illustrating, by way of example, a defense code process of a storage device 10 according to still another example embodiment of the present inventive concept.

FIG. 17 is a ladder diagram illustrating, by way of example, a defense code process of a storage device 10 according to still another example embodiment of the present inventive concept. Referring to FIGS. 1 to 17, the defense code process of the storage device 10 may be performed as follows.

The controller (CNTL) may transmit the read command to the non-volatile memory device (NVM) (S30), and the non-volatile memory device (NVM) may perform the read operation in response to the read command (S31). The data read by the read operation may be transmitted to the controller (CNTL) (S32). The controller (CNTL) may determine whether the read data is error-correctable (S33). When the UECC has occurred, the controller (CNTL) may transmit the read retry command and the original data of the error-corrected sector to the non-volatile memory device (NVM) (S34).

The non-volatile memory device (NVM) may perform the fail bit count operation using the sector data in response to the read retry command (S35). The non-volatile memory device (NVM) may perform the read level search operation using the fail bit information (FBI) (S36). Here, the read level search operation may find the optimal read level using the fail bit information (FBI). Thereafter, the non-volatile memory device (NVM) may perform the read operation using the optimal read level (S37). Thereafter, the data read by the read operation may be output to the controller (CNTL).

Figure 18:
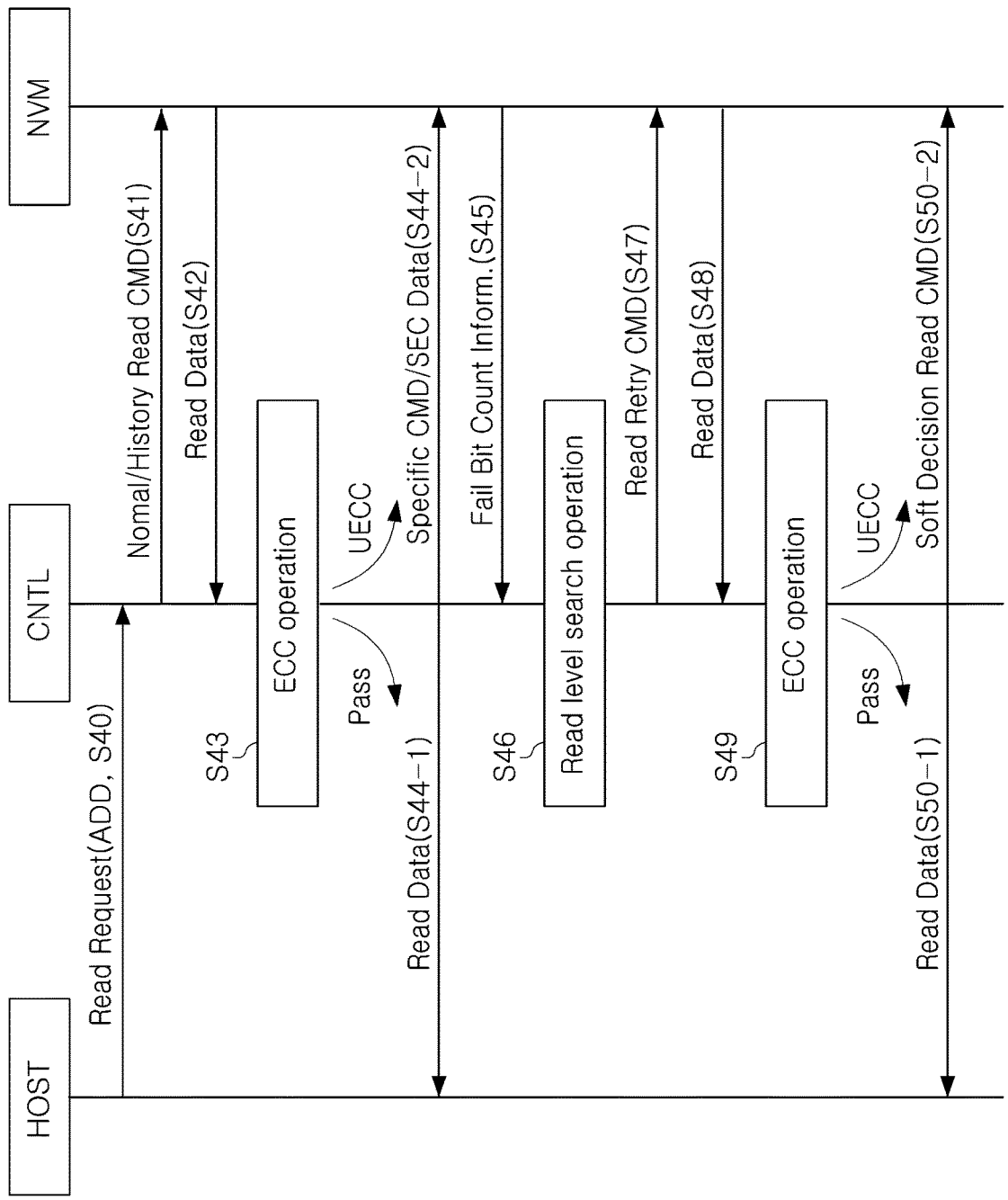
FIG. 18 is a ladder diagram illustrating, by way of example, a read operation of a storage device 10 according to another example embodiment of the present inventive concept.

FIG. 18 is a ladder diagram illustrating, by way of example, a read operation of a storage device 10 according to another example embodiment of the present inventive concept. Referring to FIGS. 1 to 18, the read operation of the storage device may be performed as follows.

The host may transmit the read request to the storage device 10 (see FIG. 1) along with the address ADD (S40). The controller 200 (CNTL) of the storage device 10 may transmit a normal/history read command to the non-volatile memory device 100 (see FIG. 1, NVM) (S41). The non-volatile memory device (NVM) may perform the read operation in response to the normal/history read command and transmit the data read accordingly to the controller (CNTL) (S42).

Thereafter, the controller (CNTL) may perform the error correction operation on the data read by the error correction circuit 230 (see FIG. 1) (S42). When there is no error or the error is correctable, the read data or the corrected data may be transmitted to the host (S44-1).

On the other hand, when the error correction is not possible, the controller (CNTL) may transmit the specific command and the sector data to the nonvolatile memory device (NVM) (S44-2). The non-volatile memory device 100 may perform the sensing operation on the sector while changing the read level in response to such a specific command, generate the fail bit information (FBI) by comparing the sensed data and the sector data, and output the generated fail bit information (FBI) to the controller (CNTL) (S45).

Thereafter, the controller (CNTL) may perform the read level search operation to determine the optimal read level of the hard decision read operation using the fail bit information (FBI) (S46). In addition, the controller (CNTL) may determine the soft decision offset of the soft decision read operation using the result of the read level search operation and the fail bit information (FBI).

Thereafter, the controller CNTL may issue the read retry command and transmit the issued read retry command to the non-volatile memory device (NVM) (S47). Here, the read retry command may include the hard decision read command. However, it should be understood that the read retry command is not limited thereto. Thereafter, the non-volatile memory device (NVM) may perform the read operation in response to the read retry command and transmit the read data to the controller (CNTL) (S48).

Thereafter, the controller (CNTL) may perform the error correction operation on the read data (S49). When there is no error or the error is correctable, the read data or the corrected data may be transmitted to the host (S50-1). On the other hand, when the error correction is not possible, the controller (CNTL) may transmit the soft decision read command to the nonvolatile memory device (NVM) (S50-2).

Meanwhile, the storage device according to the example embodiment of the present inventive concept may include an artificial intelligence processor dedicated to a defense code.

Figure 19:
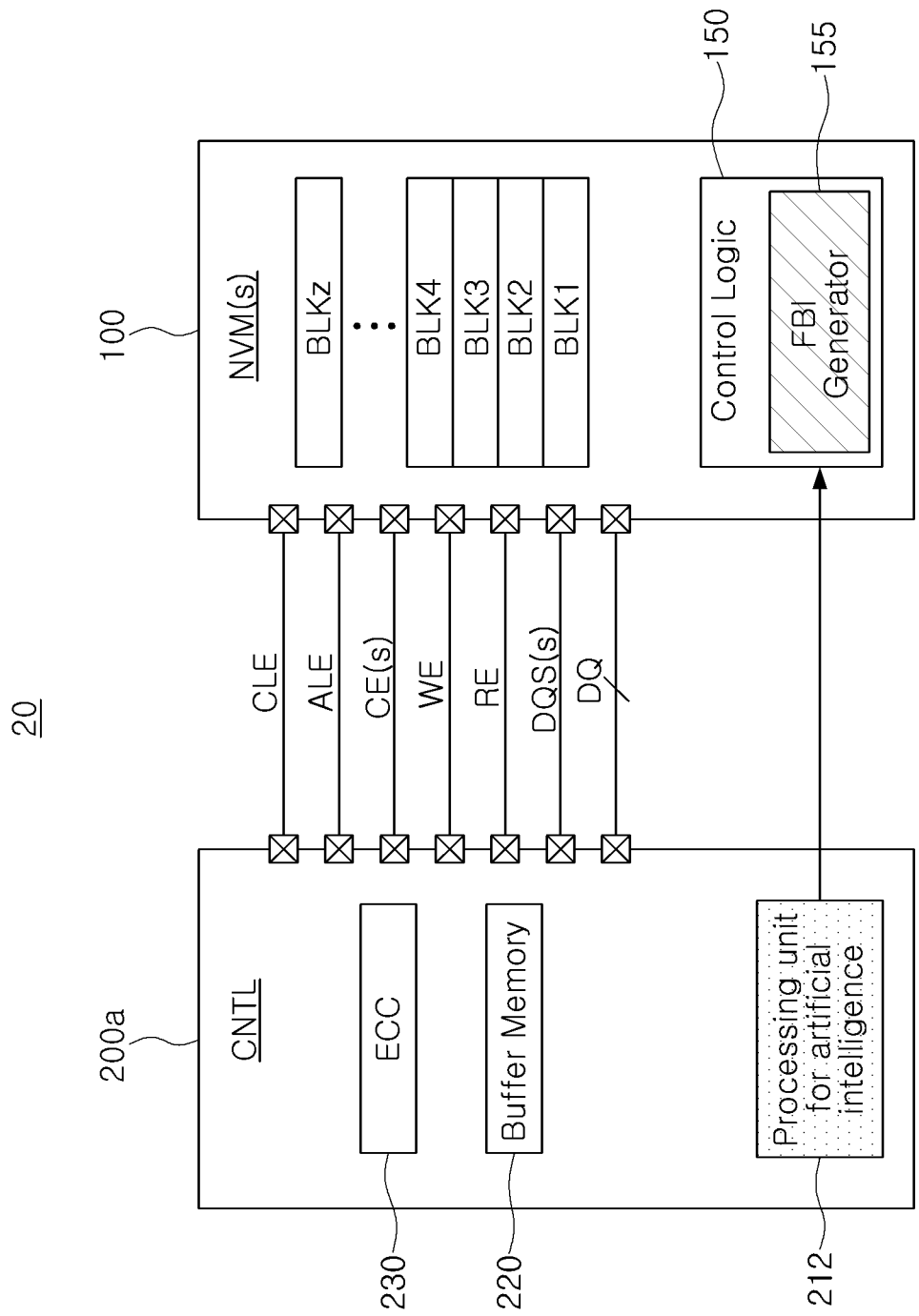
FIG. 19 is a diagram illustrating, by way of example, a storage device 20 according to another example embodiment of the present inventive concept.

FIG. 19 is a diagram illustrating, by way of example, a storage device 20 according to another example embodiment of the present inventive concept. Referring to FIG. 19, the storage device 20 may include an artificial intelligence processor 212 that controls a defense code compared to that illustrated in FIG. 1. The artificial intelligence processor 212 may perform machine learning to manage the reliability of the non-volatile memory device 100. In particular, as described in FIGS. 1 to 18, the artificial intelligence processor 212 may extract the fail bit information (FBI) for the memory cells connected to the error-corrected sector or adjacent wordlines when the UECC occurs, determine the optimal read level for the fail section using the fail bit information (FBI), or determine the soft decision offset.

Meanwhile, the non-volatile memory device according to the example embodiment of the present inventive concept may be implemented in a chip-to-chip structure.

Figure 20:
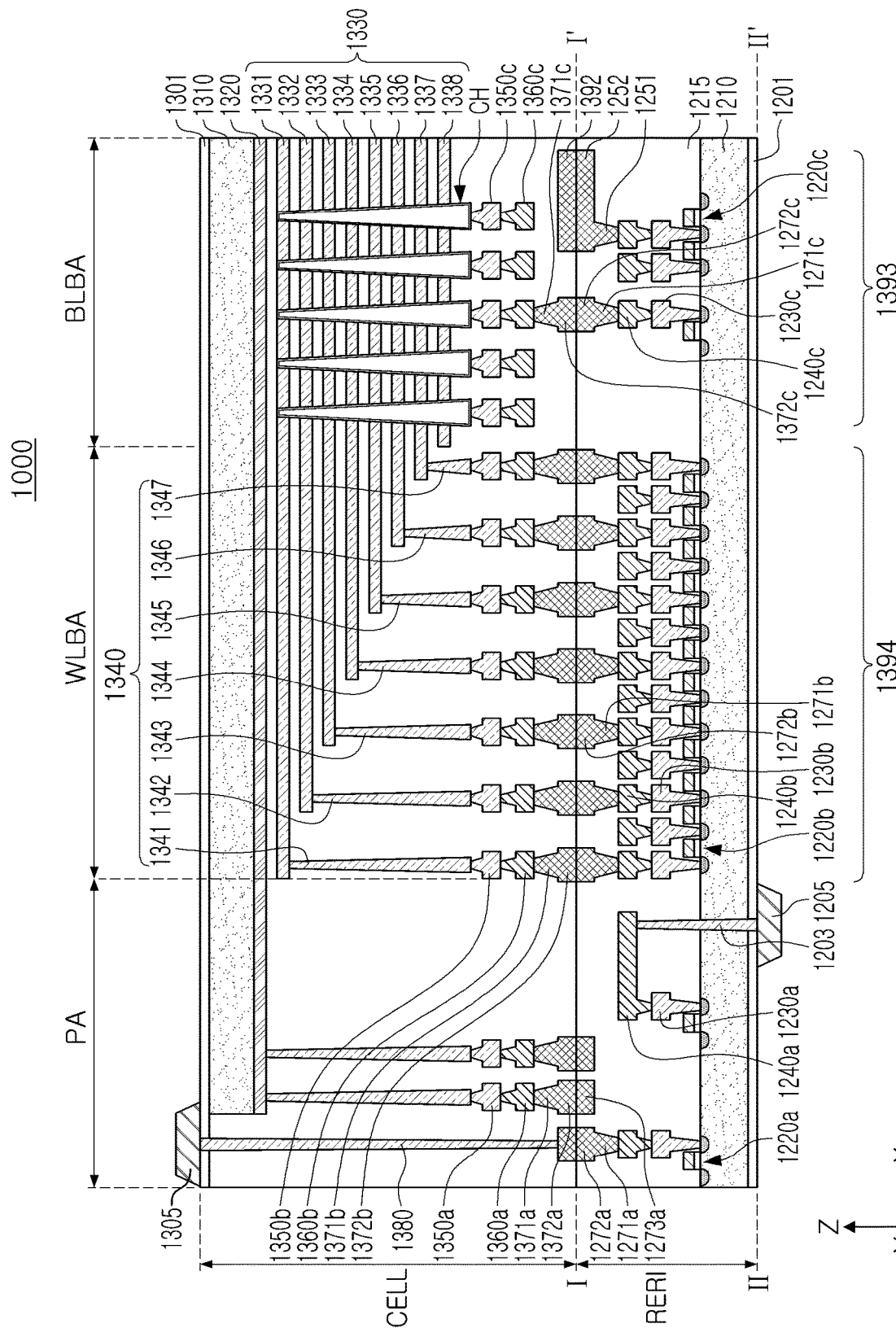
FIG. 20 is a diagram illustrating, by way of example, a non-volatile memory device 1000 implemented in a C2C structure according to an example embodiment of the present inventive concept.

FIG. 20 is a diagram illustrating, by way of example, a non-volatile memory device 1000 implemented in a C2C structure according to an example embodiment of the present inventive concept. Here, the C2C structure may mean that an upper chip including a cell area CELL is manufactured on a first wafer, and a lower chip including a peripheral circuit area PERI is manufactured on a second wafer different from the first wafer, and then the upper chip and the lower chip are connected to each other by a bonding method. For example, the bonding method may be a method of electrically connecting a bonding metal formed on an uppermost metal layer of the upper chip and a bonding metal formed on an uppermost metal layer of the lower chip. In an example embodiment, when the bonding metal is formed of copper (Cu), the bonding method may be a Cu-to-Cu bonding method. In another example embodiment, the bonding metal may be formed of aluminum (Al) or tungsten (W).

Each of the peripheral circuit area PERI and the cell area CELL of the non-volatile memory device 1000 may include an external pad bonding area PA, a wordline bonding area WLBA, and a bitline bonding area BLBA.

The peripheral circuit area PERI may include a first substrate 1210, an interlayer insulating layer 1215, a plurality of circuit elements 1220a, 1220b, and 1220c formed on the first substrate 1210, first metal layers 1230a, 1230b, and 1230c connected to the plurality of circuit elements 1220a, 1220b, and 1220c, respectively, and second metal layers 1240a, 1240b, and 1240c formed on the first metal layers 1230a, 1230b, and 1230c. In an example embodiment, the first metal layers 1230a, 1230b, and 1230c may be formed of tungsten having a relatively high specific resistance. In an example embodiment, the second metal layers 1240a, 1240b, and 1240c may be formed of copper having a relatively low specific resistance.

As illustrated in FIG. 20, the first metal layers 1230a, 1230b, and 1230c and the second metal layers 1240a, 1240b, and 1240c are illustrated, but the present inventive concept will not be limited thereto. At least one metal layer may be further formed on the second metal layers 1240a, 1240b, and 1240c. At least some of the one or more metal layers formed on the second metal layers 1240a, 1240b, and 1240c may be formed of the aluminum having a different specific resistance than that of the copper forming the second metal layers 1240a, 1240b, and 1240c.

In an example embodiment, the interlayer insulating layer 1215 may be disposed on the first substrate 1210 to cover the plurality of circuit elements 1220a, 1220b, and 1220c, the first metal layers 1230a, 1230b, and 1230c, and the second metal layers 1240a, 1240b, and 1240c. In an example embodiment, the interlayer insulating layer 1215 may include an insulating material such as silicon oxide or silicon nitride.

Lower bonding metals 1271b and 1272b may be formed on the second metal layer 1240b of the wordline bonding area WLBA. In the wordline bonding area WLBA, the lower bonding metals 1271b and 1272b of the peripheral circuit area PERI may be electrically interconnected to upper bonding metals 1371b and 1372b of the cell area CELL by the bonding method. In an example embodiment, the lower bonding metals 1271b and 1272b and the upper bonding metals 1371b and 1372b may be formed of aluminum, copper, tungsten, or the like. Additionally, the upper bonding metals 1371b and 1372b of the cell area CELL may be referred to as first metal pads, and the lower bonding metals 1271b and 1272b may be referred to as second metal pads.

The cell area CELL may include at least one memory block. In an example embodiment, the cell area CELL may include the second substrate 1310 and the common source line 1320. A plurality of wordlines 1330 (i.e., 1331 to 1338) may be stacked on the second substrate 1310 along a direction (Z-axis direction) perpendicular to an upper surface of the second substrate 1310. In an example embodiment, the string select lines and the ground select line may be disposed on each of the upper and lower portions of the wordlines 1330. In an example embodiment, the plurality of wordlines 1330 may be disposed between the string select lines and the ground select line.

In the bitline bonding area BLBA, the channel structure CH may extend in a direction (Z-axis direction) perpendicular to the upper surface of the second substrate 1310 to penetrate through the wordlines 1330, the string select lines, and the ground select line. The channel structure CH may include a data storage layer, a channel layer, and a buried insulating layer, and the channel layer may be electrically connected to a first metal layer 1350c and a second metal layer 1360c. For example, the first metal layer 1350c may be a bitline contact, and the second metal layer 1360c may be a bitline. In an example embodiment, the bitline 1360c may extend along a first direction (Y-axis direction) parallel to the upper surface of the second substrate 1310.

As illustrated in FIG. 20, an area in which the channel structure CH, the bitline 1360c, and the like are disposed may be defined as a bitline bonding area BLBA. In an example embodiment, the bitline 1360c may be electrically connected to the circuit elements 1220c providing a page buffer 1393 in the peripheral circuit area PERI in the bitline bonding area BLBA. For example, the bitline 1360c may be connected to upper bonding metals 1371c and 1372c in the peripheral circuit area PERI. Here, the upper bonding metals 1371c and 1372c may be connected to the lower bonding metals 1271c and 1272c connected to the circuit elements 1220c of the page buffer 1393. In the wordline bonding area WLBA, the wordlines 1330 may extend along a second direction (X-axis direction) parallel to the upper surface of the second substrate 1310 while being perpendicular to the first direction. In an example embodiment, the wordline bonding area WLBA may be connected to a plurality of cell contact plugs 1341 to 1347 (1340). For example, the wordlines 1330 and the cell contact plugs 1340 may be connected to each other by pads that are provided with at least some of the wordlines 1330 extending in different lengths along the second direction. In an example embodiment, the first metal layer 1350b and the second metal layer 1360b may be sequentially connected to the upper portion of the cell contact plugs 1340 connected to the wordlines 1330. In an example embodiment, the cell contact plugs 1340 may be connected to the peripheral circuit area PERI through the upper bonding metals 1371b and 1372b of the cell area CELL in the wordline bonding area WLBA and the lower bonding metals 1271a and 1271b of the peripheral circuit area PERI.

In an example embodiment, the cell contact plugs 1340 may be electrically connected to the circuit elements 1220b providing the row decoder 1394 in the peripheral circuit area PERI. In an example embodiment, the operating voltage of the circuit elements 1220b providing the row decoder 1394 may be different from that of the circuit elements 1220c providing the page buffer 1393. For example, the operating voltage of the circuit elements 1220c providing the page buffer 1393 may be greater than that of the circuit elements 1220b providing the row decoder 1394.

A common source line contact plug 1380 may be disposed in the outer pad bonding area PA. In an example embodiment, the common source line contact plug 1380 may be formed of a conductive material such as a metal, a metal compound, or polysilicon. The common source line contact plug 1380 may be electrically connected to the common source line 1320. A first metal layer 1350a and a second metal layer 1360a may be sequentially stacked on the common source line contact plug 1380. For example, an area in which the common source line contact plug 1380, the first metal layer 1350*a*, and the second metal layer 1360*a* are disposed may be defined as the outer pad bonding area PA. The second metal layer 1360*a* may be electrically connected to an upper metal via 1371*a*. The upper metal via 1371*a* may be electrically connected to an upper metal pattern 1372*a*.

Meanwhile, input/output pads 1205 and 1305 may be disposed in the external pad bonding area PA. Referring to FIG. 20, a lower insulating layer 1201 covering a lower surface of the first substrate 1210 may be formed under the first substrate 1210. In addition, a first input/output pad 1205 may be formed on the lower insulating layer 1201. In an example embodiment, the first input/output pad 1205 may be connected to at least one of the plurality of circuit elements 1220*a*, 1220*b*, and 1220*c* disposed in the peripheral circuit area PERI through the first input/output contact plug 1203. In an example embodiment, the first input/output pad 1205 may be separated from the first substrate 1210 by the lower insulating layer 1201. In addition, since a side insulating layer is disposed between the first input/output contact plug 1203 and the first substrate 1210, the first input/output contact plug 1203 and the first substrate 1210 may be electrically separated from each other.

Referring to FIG. 20, the upper insulating layer 1301 covering the upper surface of the second substrate 1310 may be formed on the second substrate 1310. In addition, a second input/output pad 1305 may be disposed on the upper insulating layer 1301. In an example embodiment, the second input/output pad 1305 may be connected to at least one of the plurality of circuit elements 1220*a*, 1220*b*, and 1220*c* disposed in the peripheral circuit area PERI through a second input/output pad 1305, a second input/output contact plug 1303, a lower metal pattern 1272*a*, and a lower metal via 1271*a*.

In an example embodiment, the second substrate 1310, the common source line 1320, and the like may not be disposed in the area where the second input/output contact plug 1303 is disposed. In addition, the second input/output pad 1305 may not overlap with the wordlines 1380 in a third direction (Z-axis direction). Referring to FIG. 20, the second input/output contact plug 1303 may be separated from the second substrate 1310 in a direction parallel to the upper surface of the second substrate 1310. Also, the second input/output contact plug 1303 may penetrate through the interlayer insulating layer 1315 of the cell area CELL to be connected to the second input/output pad 1305. In an example embodiment, the second input/output pad 1305 may be electrically connected to the circuit element 1220*a*.

In an example embodiment, the first input/output pad 1205 and the second input/output pad 1305 may be selectively formed. For example, the non-volatile memory device 1000 may include only the first input/output pad 1205 disposed on the first substrate 1201, or only the second input/output pad 1305 disposed on the second substrate 1301. In another example embodiment, the non-volatile memory device 1000 may include both the first input/output pad 1205 and the second input/output pad 1305.

The metal pattern of the uppermost metal layer may exist as a dummy pattern in the outer pad bonding area PA and the bitline bonding area BLBA, respectively, included in the cell area CELL and the peripheral circuit area PERI, respectively, or the uppermost metal layer may be empty in the outer pad bonding area PA and the bitline bonding area BLBA, respectively.

In the non-volatile memory device 1000 according to the example embodiment of the present inventive concept, a lower metal pattern 1273*a* having the same shape as the upper metal pattern 1372*a* of the cell area CELL may be formed on the uppermost metal layer of the peripheral circuit area PERI to correspond to the upper metal pattern 1372*a* formed on the uppermost metal layer of the cell area CELL in the external pad bonding area PA. The lower metal pattern 1273*a* formed on the uppermost metal layer of the peripheral circuit area PERI may not be connected to a separate contact in the peripheral circuit area PERI. Similarly, the upper metal pattern having the same shape as the lower metal pattern of the parallel circuit area PERI may be formed on the upper metal layer of the cell area CELL to correspond to the lower metal pattern formed on the uppermost metal layer of the peripheral circuit area PERI in the outer pad bonding area PA.

The storage device according to the example embodiment of the present inventive concept may correct the data of the fail sector using information on the corrected area (e.g., corrected sector or adjacent WL in the same page) having the scatter shape similar to the fail sector when the UECC occurs.

In an example embodiment, after receiving the original data of the corrected area from the controller to the NAND, 0/1 fail bit information according to the read level may be derived by comparing the sensing result according to the read level with the original data.

In an example embodiment, data may be corrected by applying a read level in which the sum of the 0 fail bit and 1 fail bit obtained in the corrected area becomes minimum to the fail sector.

In an example embodiment, an optimal soft decision offset may be set using the 0 fail bit and the 1 fail bit information obtained in the corrected area.

Meanwhile, in the read operation of the present inventive concept, the fail bit information is derived by comparing the original data of the error-corrected sector with the sensing data, and the read operation for the fail sector is again performed using the derived fail bit information. However, the fail bit information of the present inventive concept need not be limited to the error-corrected sector. The present inventive concept may derive the fail bit information by comparing the original data of the sector connected to the wordline adjacent to the fail sector with the sensing data, and perform the read operation on the fail sector again using the derived fail bit information.

According to example embodiments, the non-volatile memory device, the controller for controlling the same, the storage device having the same, and the reading method thereof may improve the reliability of the read operation by finding the optimum read level or setting the soft decision offset using the fail bit information of the error-corrected sector when the error correction is not possible.

On the other hand, the contents of the present inventive concept described above are only specific examples for carrying out the invention. The present inventive concept will include not only concrete and practical means itself, but also technical ideas which are abstract and conceptual ideas that may be used as technology in the future.

What is claimed is:

1. A non-volatile memory device, comprising:
   a memory cell array having a plurality of memory blocks having a plurality of memory cells connected to a plurality of wordlines and a plurality of bitlines;
   a row decoder configured to select one of the plurality of memory blocks in response to an address;
   a voltage generator configured to provide corresponding wordline voltages to selected wordline and unselected wordlines among the plurality of wordlines;

page buffers connected to the plurality of bitlines and configured to read data from memory cells connected to the selected wordline of a memory block selected from the plurality of memory blocks; and a control logic configured to control the row decoder, the voltage generator, and the page buffers, wherein the control logic receives first data of at least one sector of the non-volatile memory from a controller, performs a sensing operation of first memory cells corresponding to the first data among the memory cells using a read level to obtain second data, compares the first data and second data of the sensing operation, and counts a fail bit according to the comparison result.

2. The non-volatile memory device of claim 1, wherein the first data includes data of a sector passed in an error correction operation.

3. The non-volatile memory device of claim 1, wherein an XOR operation is performed on the first data and the second data to compare the first data and the second data.

4. The non-volatile memory device of claim 3, wherein the XOR operation is performed in each of the page buffers corresponding to the at least one sector among the page buffers.

5. The non-volatile memory device of claim 4, further comprising:
a cell counter configured to count the fail bit using output values of each of the page buffers corresponding to the at least one sector.

6. The non-volatile memory device of claim 1, wherein the controller generates a fail bit count value according to the read level while increasing the read level corresponding to a target state in a stepwise manner.

7. The non-volatile memory device of claim 6, wherein the fail bit count value includes a '0' fail bit count value or a '1' fail bit count value.

8. The non-volatile memory device of claim 7, wherein fail bit information having the '0' fail bit count value and the '1' fail bit count value for each read level is transmitted to an external controller.

9. The non-volatile memory device of claim 1, wherein the control logic receives a hard decision read level according to fail bit information corresponding to the at least one sector from an external controller, and uses the hard decision read level to perform a hard decision read operation to read data from the first memory cells corresponding to the at least one sector.

10. The non-volatile memory device of claim 1, wherein the control logic receives a soft decision offset information according to fail bit information corresponding to the at least one sector from an external controller, and uses the soft decision offset information to perform a soft decision read operation to read data from the first memory cells corresponding to the at least one sector.

11. A reading method of a storage device having at least one non-volatile memory device and a controller for controlling the at least one non-volatile memory device, the reading method comprising:
transmitting a first read command from the controller to the at least one non-volatile memory device;
receiving, by the controller, first read data corresponding to the first read command from the at least one non-volatile memory device;
transmitting error-corrected sector data from the controller to the at least one non-volatile memory device along with a specific command, when an error correction of the first read data is not possible;
receiving, by the controller, fail bit information from the at least one non-volatile memory device;
performing, by the controller, a read level search operation using the fail bit information;
transmitting, by the controller, a read level and a second read command determined in the read level search operation to the at least one non-volatile memory device; and
receiving, by the controller, second read data corresponding to the second read command from the at least one non-volatile memory device.

12. The reading method of claim 11, wherein the specific command includes a read retry command, and
the first read command and the second read command are the same.

13. The reading method of claim 11, wherein the fail bit information includes a '0' fail bit count value and a '1' fail bit count value according to the read level.

14. The reading method of claim 13, wherein the performing of the read level search operation includes:
summing a '0' fail bit count value and a '1' fail bit count value according to the read level; and
determining a point at which the summed fail bit value is minimized as an optimal read level.

15. The reading method of claim 11, further comprising:
setting, by the controller, a soft decision offset using the fail bit information.

16. A storage device, comprising:
at least one non-volatile memory device; and
a controller connected to the at least one non-volatile memory device by control pins providing a command latch enable (CLE) signal, an address latch enable (ALE) signal, a chip enable (CE) signal, a write enable (WE) signal, a read enable (RE) signal, a strobe signal (DQS) to the at least one non-volatile memory device and configured to read data from the at least one non-volatile memory,
wherein the at least one non-volatile memory device performs a fail bit count operation by latching a specific command at an edge of the WE signal according to the CLE signal and the ALE signal, and
wherein the fail bit count operation compares sensing data and original data while changing a read level, counts a fail bit corresponding to the comparison result, and generates fail bit information according to the read level.

17. The storage device of claim 16, wherein the controller searches for an optimal read level or sets a soft decision offset using the fail bit information.

18. The storage device of claim 16, wherein the at least one non-volatile memory device searches for an optimum read level using the fail bit information, and performs a read operation using the optimum read level.

19. The storage device of claim 16, wherein the original data is set to '1' when a memory cell is in a state lower than a target level, and is set to '0' when the memory cell is in a state higher than the target level.

20. The storage device of claim 16, wherein the fail bit count operation includes an XOR operation on the sensing data and the original data.

* * * * *